United States Patent
Tazawa et al.

(10) Patent No.: US 11,611,170 B2
(45) Date of Patent: Mar. 21, 2023

(54) SEMICONDUCTOR DEVICES HAVING EXPOSED CLIP TOP SIDES AND METHODS OF MANUFACTURING SEMICONDUCTOR DEVICES

(71) Applicant: Amkor Technology Singapore Holding Pte. Ltd., Valley Point (SG)

(72) Inventors: Masaya Tazawa, Kanagawa (JP); Shingo Nakamura, Kanagawa (JP)

(73) Assignee: Amkor Technology Singapore Holding Pte. Ltd, Singapore (SG)

( * ) Notice: Subject to any disclaimer, the term of this patent is extended or adjusted under 35 U.S.C. 154(b) by 11 days.

(21) Appl. No.: 17/209,513

(22) Filed: Mar. 23, 2021

(65) Prior Publication Data
US 2022/0311168 A1 Sep. 29, 2022

(51) Int. Cl.
  H01R 13/508 (2006.01)
  H01L 23/31 (2006.01)
  H01L 21/50 (2006.01)

(52) U.S. Cl.
  CPC ........... *H01R 13/508* (2013.01); *H01L 21/50* (2013.01); *H01L 23/31* (2013.01)

(58) Field of Classification Search
  CPC ........ H01R 13/508; H01L 23/31; H01L 21/50
  USPC ....................................................... 257/727
  See application file for complete search history.

(56) References Cited

U.S. PATENT DOCUMENTS

| | | |
|---|---|---|
| 6,608,366 B1 | 8/2003 | Fogelson et al. |
| 7,285,849 B2 | 10/2007 | Cruz et al. |
| 10,896,869 B2 | 1/2021 | Yeo et al. |
| 2004/0169289 A1 | 9/2004 | Satou et al. |
| 2005/0093127 A1 | 5/2005 | Fjelstad |
| 2006/0001136 A1 | 1/2006 | Tao |
| 2008/0272472 A1 | 11/2008 | Hata et al. |

(Continued)

OTHER PUBLICATIONS

PQFN Data Sheet/Power Products, Amkor Technology, Inc. Rev. 12/19; amkor.com.

*Primary Examiner* — Quoc D Hoang
(74) *Attorney, Agent, or Firm* — Kevin B. Jackson

(57) ABSTRACT

In one example, a method of manufacturing a semiconductor device includes providing a substrate having substrate terminals and providing a component having a first component terminal and a second component terminal adjacent to a first major side of the component. The method includes providing a clip structure having a first clip, a second clip, and a clip connector coupling the first clip to the second clip. The method includes coupling the first clip to the first component terminal and a first substrate terminal and coupling the second clip to a second substrate terminal. The method includes encapsulating the component, portions of the substrate, and portions of the clip structure. the method includes removing a sacrificial portion of the clip connector while leaving a first portion of the clip connector attached to the first clip and leaving a second portion of the clip connector attached to the second clip. In some examples, the first portion of the clip connector includes a first portion surface, the second portion of the clip connector includes a second portion surface, and the first portion surface and the second portion surface are exposed from a top side of the encapsulant after the removing. Other examples and related structures are also disclosed herein.

20 Claims, 19 Drawing Sheets

(56) References Cited

U.S. PATENT DOCUMENTS

| | | |
|---|---|---|
| 2010/0000772 A1 | 1/2010 | Letterman, Jr. |
| 2011/0096509 A1 | 4/2011 | Yoshimochi |
| 2013/0249051 A1 | 9/2013 | Saye |
| 2013/0307129 A1 | 11/2013 | Fujita |
| 2014/0001616 A1 | 1/2014 | Daniels et al. |
| 2014/0027891 A1 | 1/2014 | Kimura |
| 2014/0191381 A1 | 7/2014 | Lee |
| 2015/0049421 A1 | 2/2015 | Paek |
| 2015/0179553 A1 | 6/2015 | Khor |
| 2015/0270197 A1 | 9/2015 | Taguchi |
| 2015/0348889 A1 | 12/2015 | Tsai |
| 2016/0093559 A1 | 3/2016 | Xue |
| 2016/0372403 A1 | 12/2016 | Lam |
| 2017/0077361 A1 | 3/2017 | Brandl |
| 2017/0141019 A1 | 5/2017 | Arrigoni |
| 2017/0141068 A1 | 5/2017 | Kadoguchi |
| 2017/0162403 A1* | 6/2017 | Terrill ................. H01L 23/3157 |
| 2019/0057921 A1 | 2/2019 | Ooshima |
| 2019/0206772 A1 | 7/2019 | How |
| 2020/0328140 A1* | 10/2020 | Tey ......................... H01L 21/56 |
| 2021/0035891 A1* | 2/2021 | Lam ................... H01L 23/3107 |

\* cited by examiner

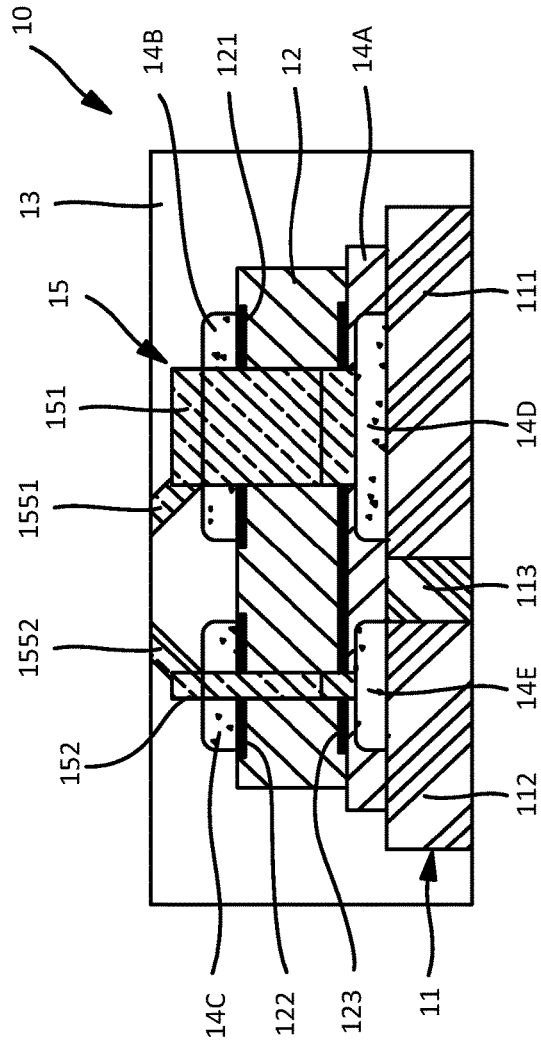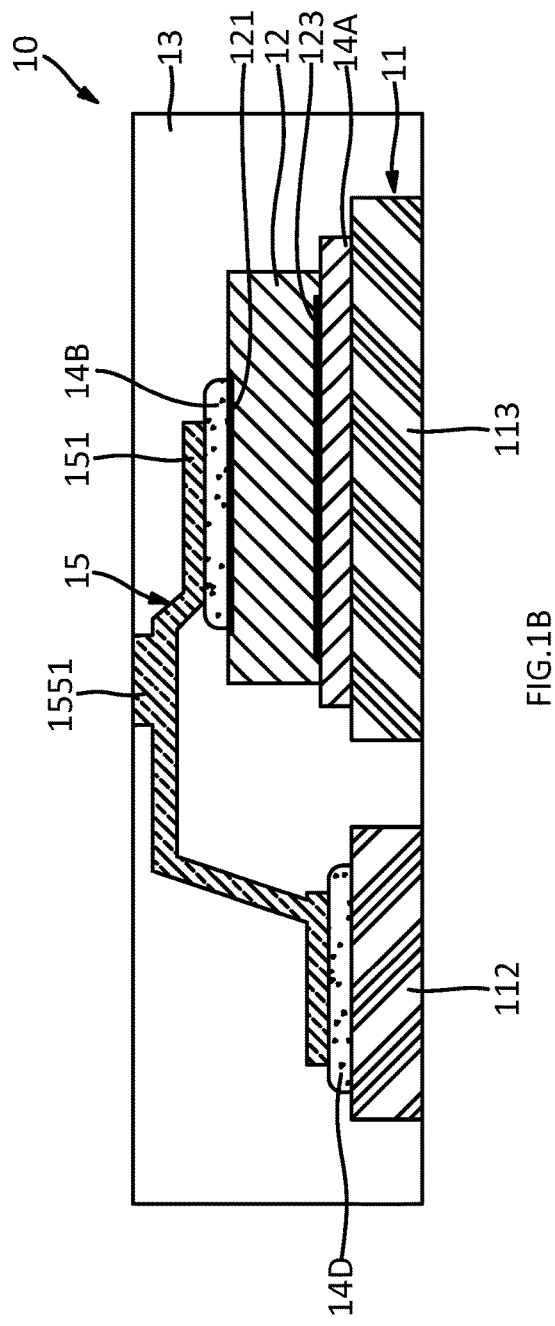

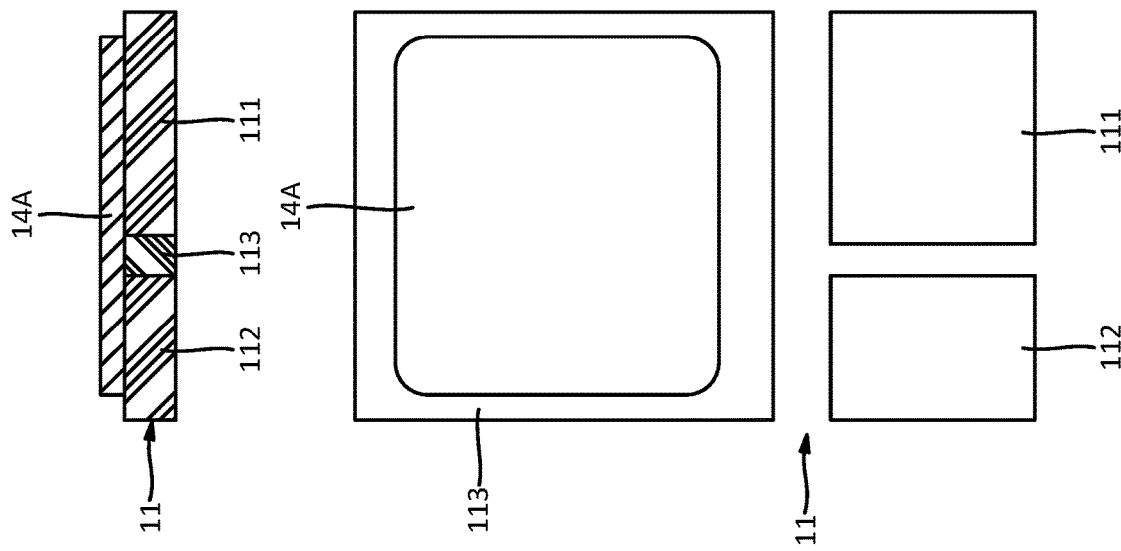
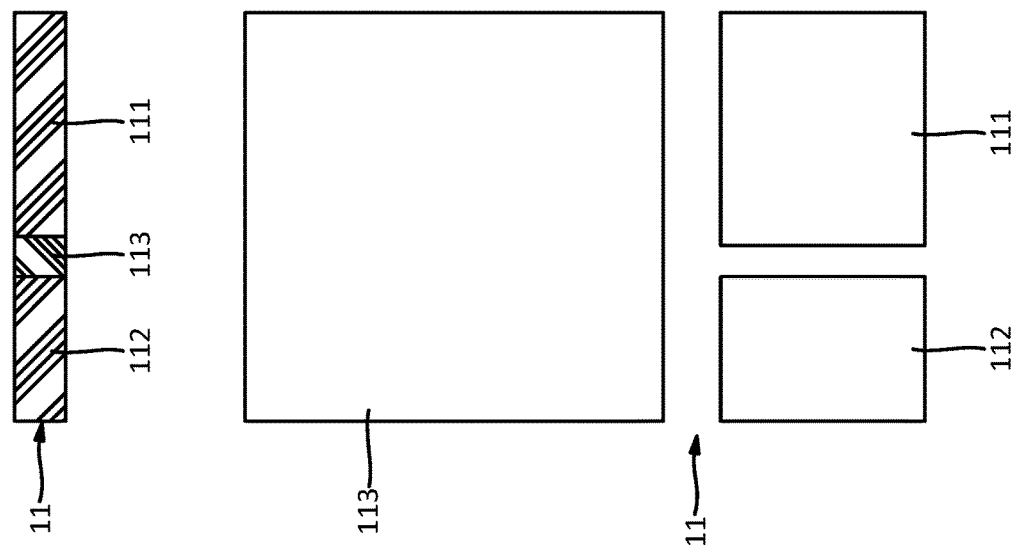

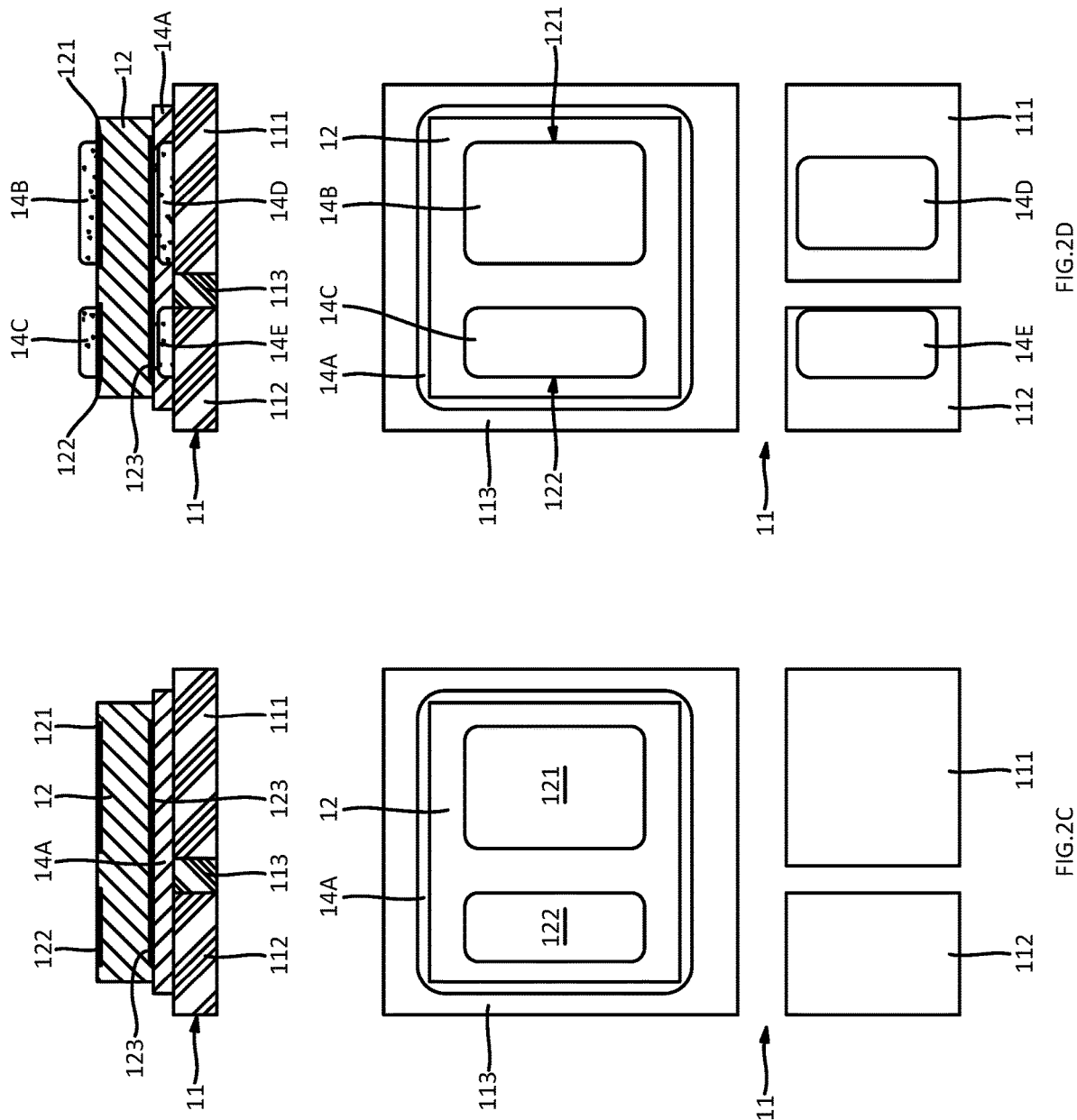

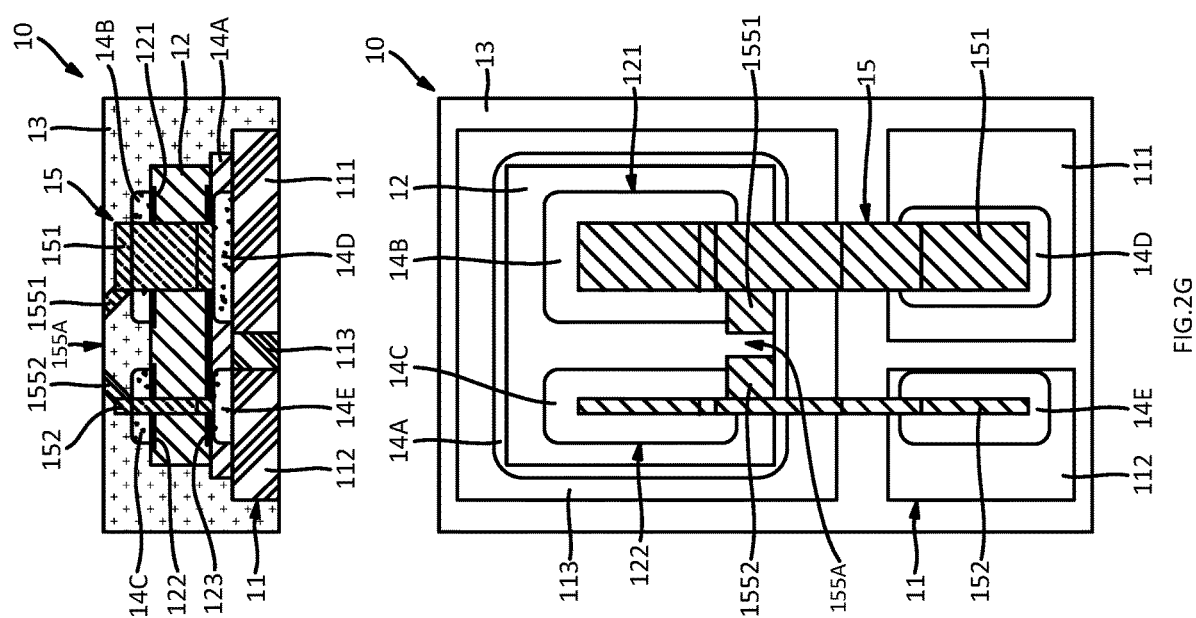

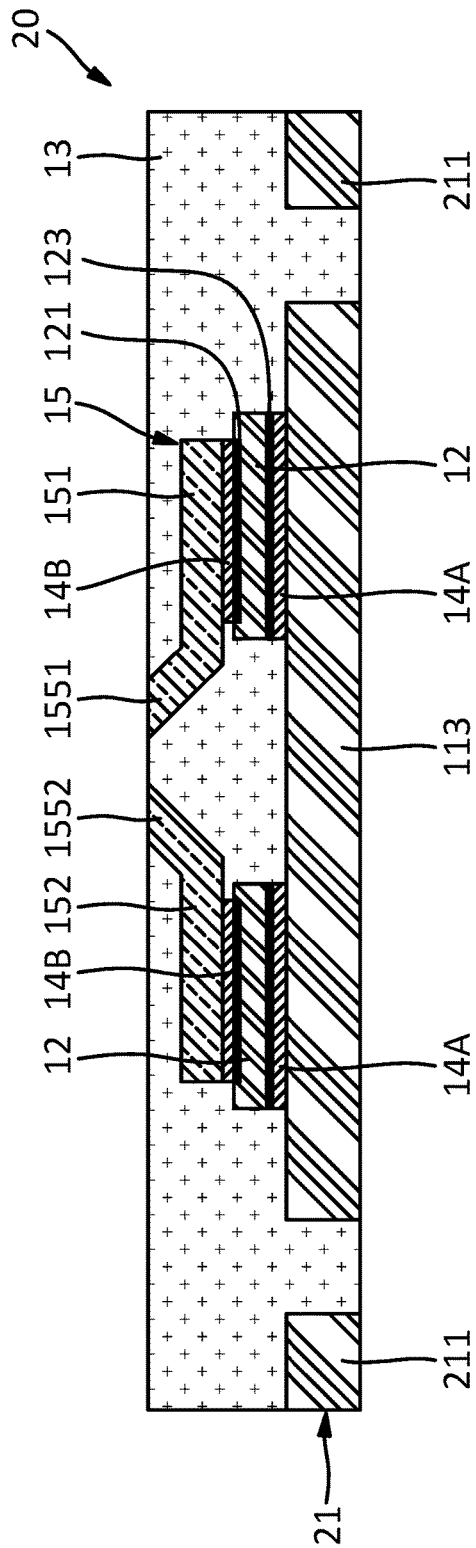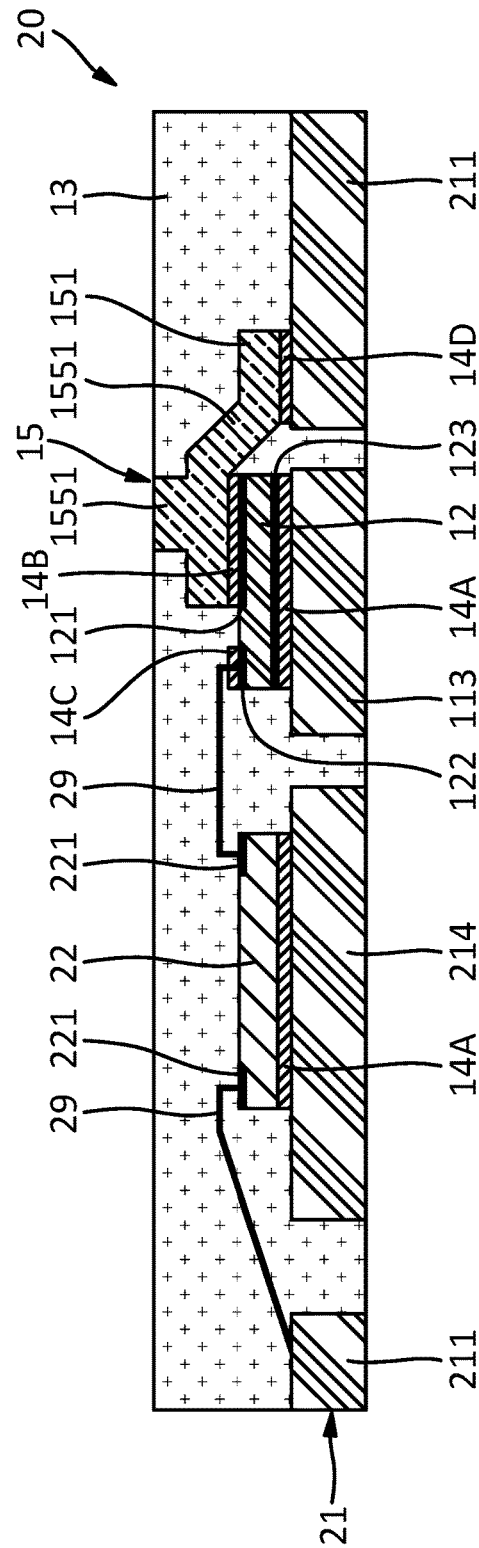

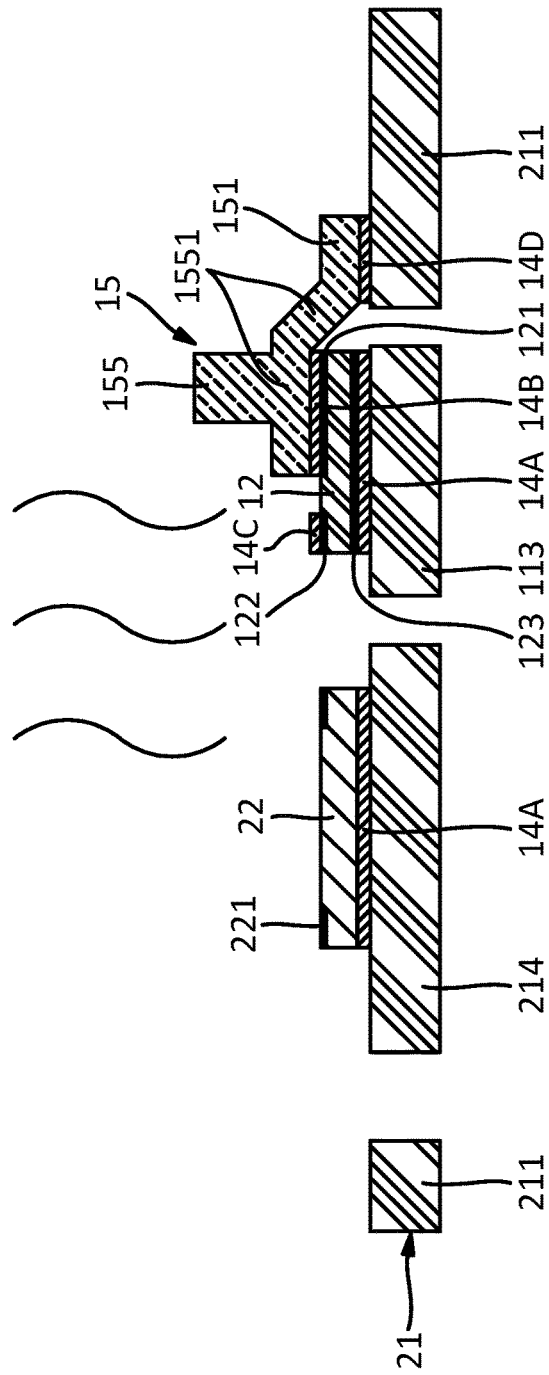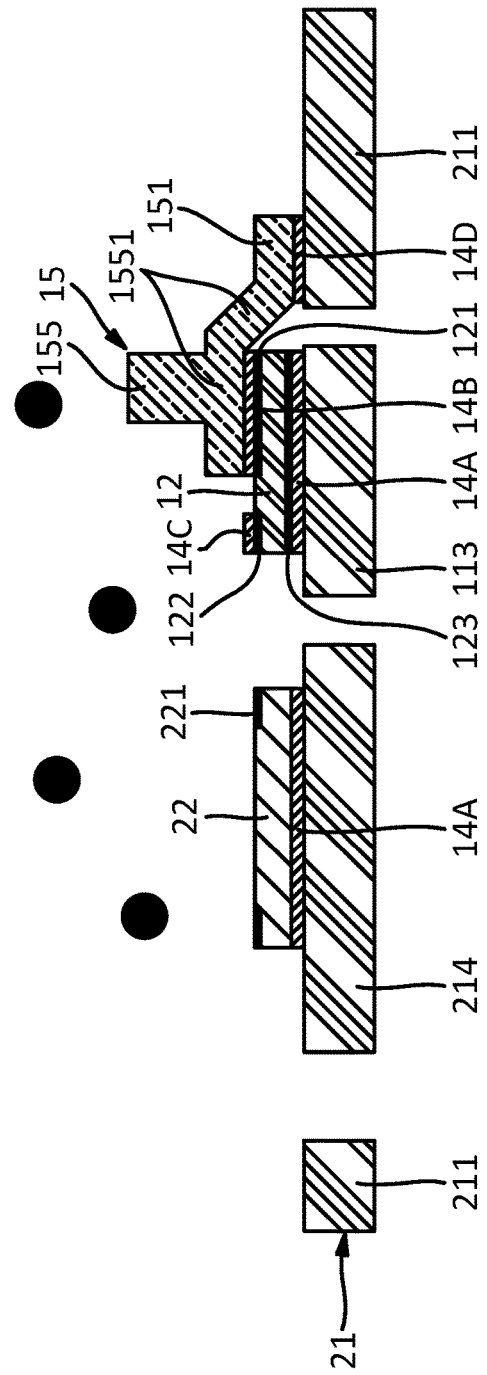

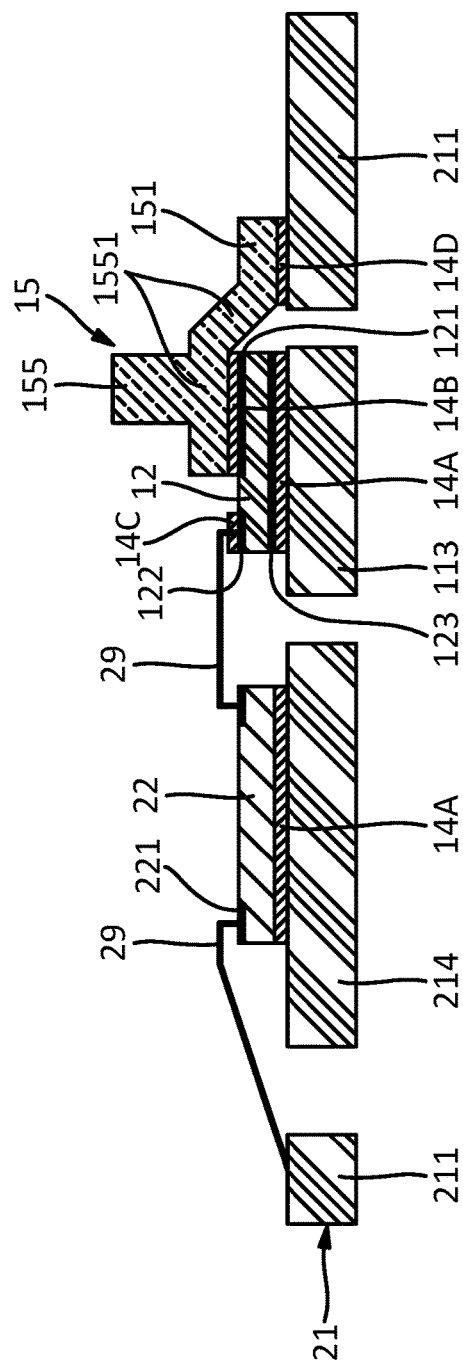
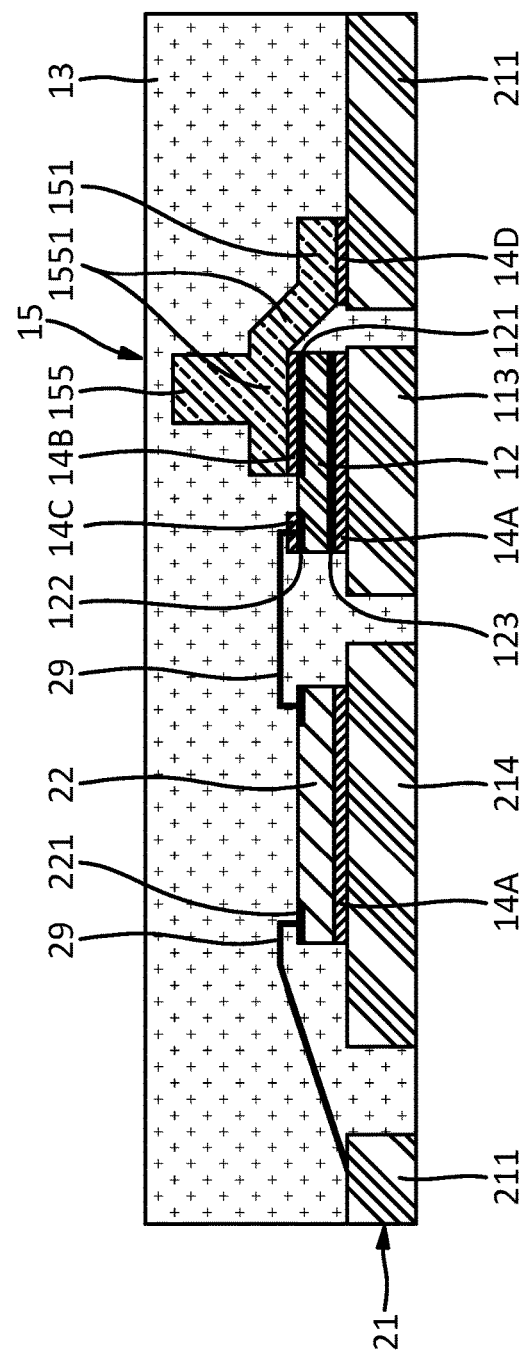
FIG.4G
FIG.4H

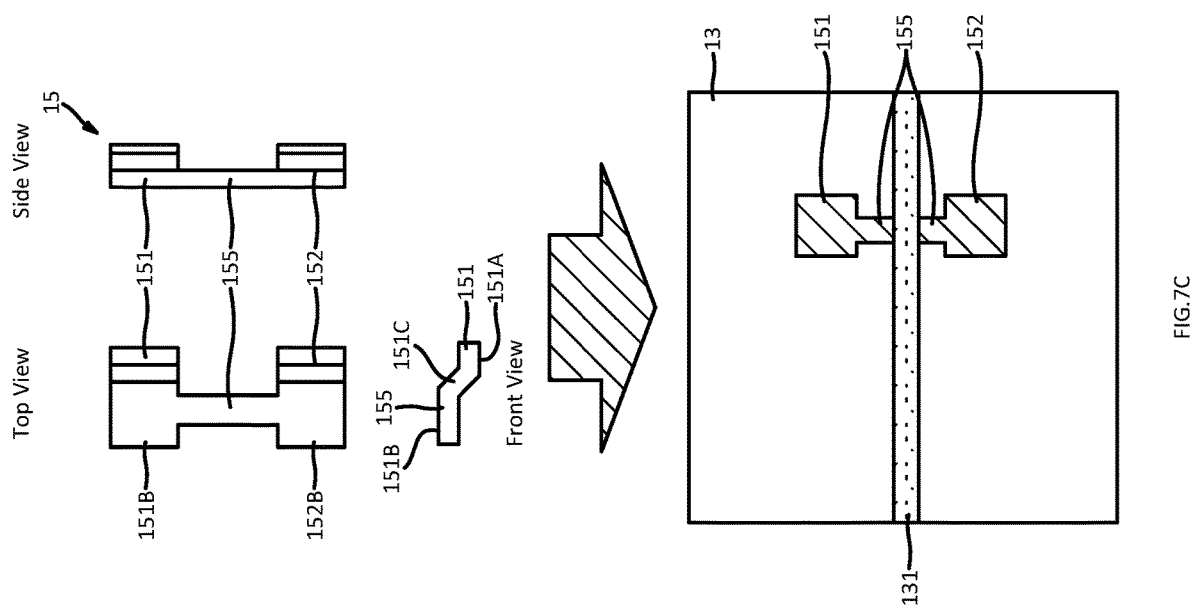

SEMICONDUCTOR DEVICES HAVING EXPOSED CLIP TOP SIDES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 1A and 1B show cross-sectional views of an example semiconductor device and FIG. 1C shows a plan view of an example semiconductor device.

FIGS. 2A, 2B, 2C, 2D, 2E, 2F, and 2G show cross-sectional views and plan views of an example method for manufacturing an example semiconductor device.

FIGS. 3A and 3B show cross-sectional views of an example semiconductor device and FIG. 3C shows a plan view of an example semiconductor device.

FIGS. 4A, 4B, 4C, 4D, 4E, 4F, 4G, 4H, and 4I show cross-sectional views and plan views of an example method for manufacturing an example semiconductor device.

FIGS. 7A, 7B, and 7C show top view, side view and front view of an example method for manufacturing an example semiconductor device.

Figure 1C:
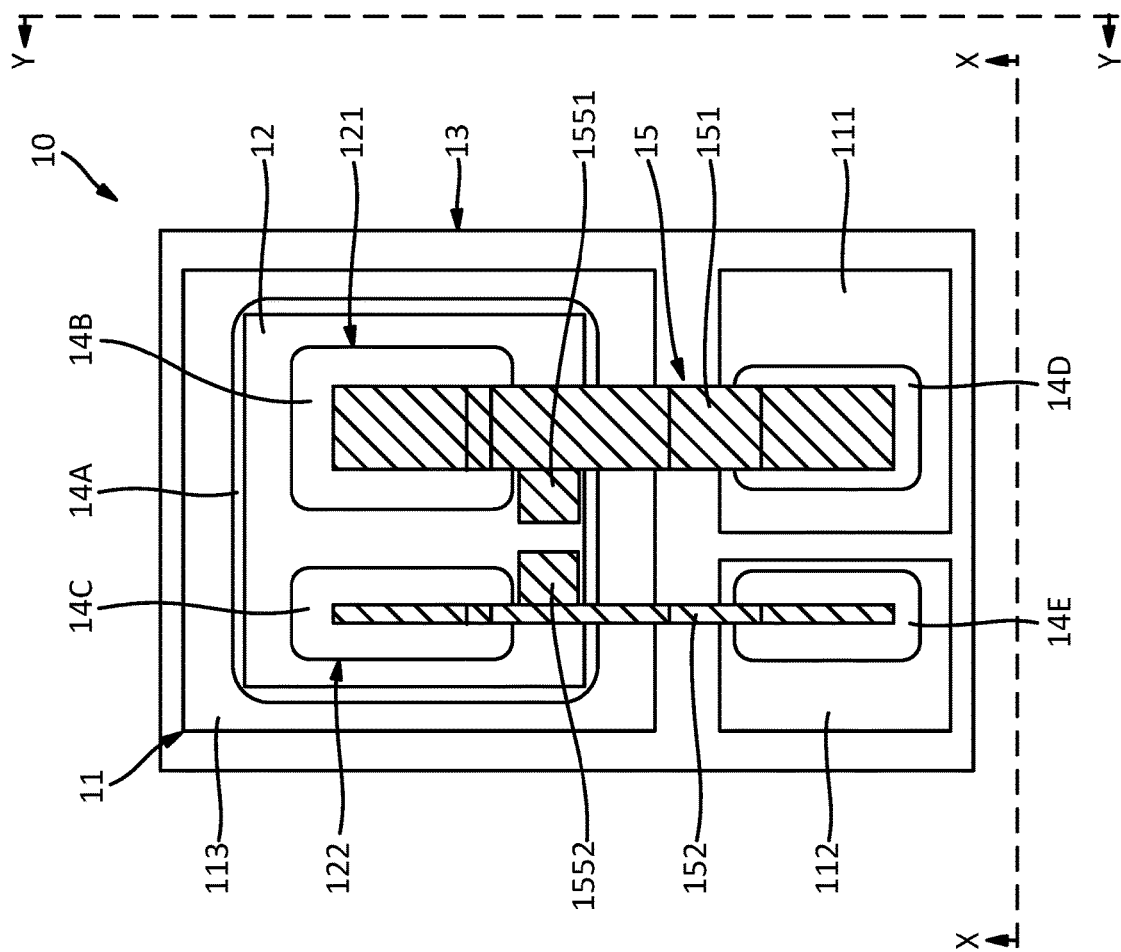

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In an example, a semiconductor device includes a substrate having substrate terminals, a first semiconductor component having a first component terminal and a second component terminal adjacent to a first major side of the first semiconductor component, and a clip structure including a first clip coupled to the first component terminal and a first substrate terminal, and a second clip coupled to a second substrate terminal. In some examples, an encapsulant covers the first semiconductor component, at least portions of the substrate, and at least portions of the clip structure. In some examples, a top side of the first clip and a top side of the second clip are exposed from a top side of the encapsulant.

In an example, a semiconductor device includes a substrate having a first substrate terminal, a second substrate terminal, and a third substrate terminal. A semiconductor component includes a first major side, a second major side opposite to the first major side, a first component terminal and a second component terminal adjacent to the first major side, and the second major side can be coupled with the third substrate terminal. A clip structure includes a first clip having a first component-attached region with an upper surface, the first component-attached region coupled to the first component terminal, and a first substrate-attached region coupled to the first component-attached region and the first substrate terminal. The clip structure includes a second clip having a second component-attached region with an upper surface, and a second substrate-attached region coupled to the second component-attached region and the second substrate terminal. A first clip leg can be coupled to the first clip between the first clip and the second clip and the first clip leg can include a first leg end. A second clip leg can be coupled to the second clip between the first clip and the second clip, and the second clip leg can include a second leg end. an encapsulant can cover portions of the substrate, the first semiconductor component, and portions of the clip structure. In some examples, the first clip leg and the second clip leg are separated by a gap. In some examples, the first leg end and the second leg end are exposed from a major side of the encapsulant.

In an example, a method of manufacturing a semiconductor device includes providing a substrate having substrate terminals and providing a first semiconductor component having a first component terminal and a second component terminal adjacent to a first major side of the first semiconductor component. The method includes providing a clip structure having a first clip, a second clip, and a clip connector coupling the first clip to the second clip. The method includes coupling the first clip to the first component terminal and a first substrate terminal and coupling the second clip to a second substrate terminal. The method includes encapsulating the first semiconductor component, portions of the substrate, and portions of the clip structure. The method includes removing a sacrificial portion of the clip connector while leaving a first portion of the clip connector attached to the first clip and leaving a second portion of the clip connector attached to the second clip. The first portion of the clip connector includes a first portion surface, the second portion of the clip connector includes a second portion surface, and the first portion surface and the second portion surface are exposed from a top side of the encapsulant after the removing.

Other examples are included in the present disclosure. Such examples may be found in the figures, in the claims, or in the description of the present disclosure.

FIGS. 1A and 1B show cross-sectional views of an example semiconductor device 10, and FIG. 1C shows a plan x-ray view of example semiconductor device 10. FIG. 1A is a view taken from the perspective of line X-X of FIG. 1C, and FIG. 1B is a view taken from the perspective of line Y-Y of FIG. 1C. In the example shown in FIGS. 1A to 1C, semiconductor device 10 can comprise substrate 11, semiconductor component 12, encapsulant 13, interface materials 14A, 14B, 14C, 14D and 14E, and clip structure 15.

Substrate 11 can comprise substrate terminals 111, 112 and 113. Clip structure 15 can comprise clips 151 and 152, clip joint 155 (illustrated in FIG. 2E), clip legs 1551 and 1552. In some examples, clip joint 155 and clip legs 1551 and 1552 can be referred to as a clip connector, a conductive bridge, a conductive connector, a conductive bar, or a conductive interface.

Substrate 11, encapsulant 13 and clip structure 15 can be referred to as a semiconductor package and package can provide protection for semiconductor component 12 from external elements or environmental exposure. Semiconductor package can provide coupling between external electrical components and substrate terminals 111, 112 and 113.

Figure 2E:
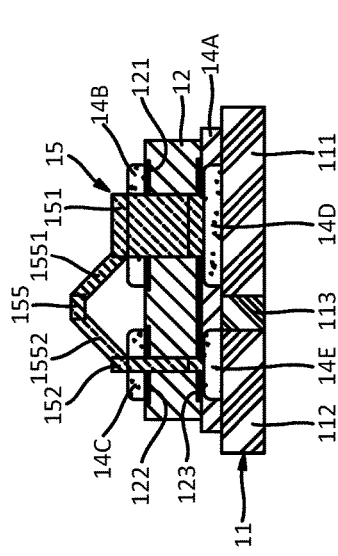
Figure 2E:
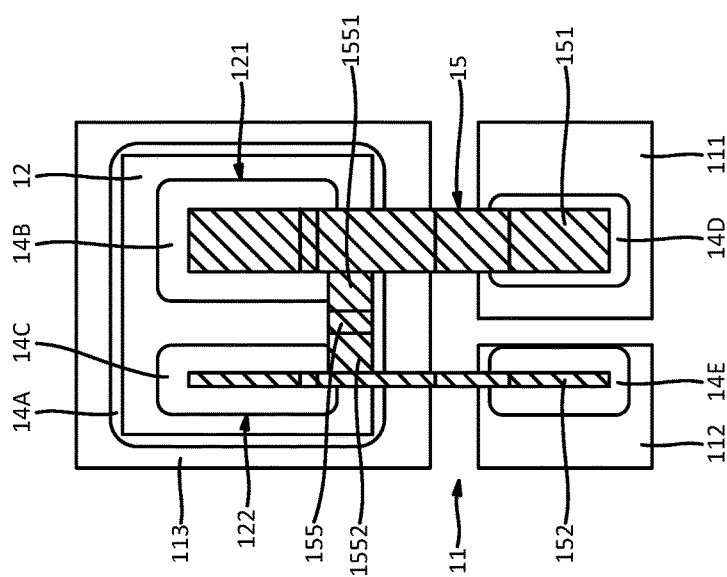

FIGS. 2A, 2B, 2C, 2D, 2E, 2F, and 2G show cross-sectional views and plan views of an example method for manufacturing semiconductor device 10. In the following, reference is made to FIGS. 1A, 1B, and 1C together. FIG. 2A shows a cross-sectional view and plan view of semiconductor device 10 at an early stage of manufacture.

In the example shown in FIG. 2A, substrate 11 can be provided. In some examples, substrate 11 can comprise or be referred to as a lead frame substrate, a laminate substrate, or a printed circuit board. In some examples, substrate 11 can comprise copper (Cu), Cu alloy, iron (Fe), Fe alloy or Fe—Ni alloy. In some examples, substrate 11 can comprise a coating or plating layer provided on a side of substrate 11, such as nickel (Ni), palladium (Pd), gold (Au), silver (Ag), or solder (Sn). Substrate 11 can comprise substrate terminals 111, 112 and 113. In some examples, substrate terminals 111, 112 and 113 can comprise substantially rectangular plates. In some examples, substrate terminal 113 can have a larger area than substrate terminals 111 or 112. In some examples, substrate terminals 111 or 112 can comprise or be referred to as leads. In some examples, substrate terminal 113 can comprise or be referred to as a lead, a paddle, a pad or a flag. In some examples, substrate terminals 111, 112 and 113 can be provided through etching or stamping. In some examples, substrate 11 can have an area ranging from approximately 3 mm (millimeter)×3 mm to approximately 15 mm×15 mm. In some examples, substrate 11 can have a thickness ranging from approximately 100 μm (micrometer) to approximately 200 μm. In some examples, substrate terminals 111 or 112 can have an area ranging from approximately 1 mm×1 mm to approximately 10 mm×10 mm, or can have a thickness ranging from approximately 100 μm to approximately 200 μm. In some examples, an area of substrate terminal 113 can be dependent on a size of semiconductor component 12, or can be in a range from approximately 1.5 mm×1.5 mm to approximately 15 mm×15 mm. In some examples, substrate terminal 113 can have a thickness ranging from approximately 100 μm to approximately 200 μm. Substrate 11 can serve as wiring for coupling semiconductor component 12 with an external component (for example, a motherboard or circuit board).

FIG. 2B shows a cross-sectional view and plan view of semiconductor device 10 at a later stage of manufacture. In the example shown in FIG. 2B, interface material 14A can be provided on substrate terminal 113. In some examples, an area of interface material 14A can be equal to or smaller than substrate terminal 113. In some examples, interface material 14A can comprise or be referred to as a solder, a conductive adhesive or a conductive paste. In some examples, interface material 14A can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, interface material 14A can be provided on substrate terminal 113 by coating or dispensing in the form of a paste. In some examples, interface material 14A can have a thickness ranging from approximately 5 μm to approximately 100 μm. Interface material 14A can couple semiconductor component 12 and substrate terminal 113.

FIG. 2C shows a cross-sectional view and plan view of semiconductor device 10 at a later stage of manufacture. In the example shown in FIG. 2C, semiconductor component 12 can be provided on substrate terminal 113. In some examples, semiconductor component 12 can be arranged on interface material 14A. Semiconductor component 12 can comprise or be referred to as a die, a chip, or a power component such as a field-effect transistor (FET) or an insulated-gate bipolar transistor (IGBT). In some examples, semiconductor component 12 can comprise component terminals 121 and 122 provided at a top side of semiconductor component 12, and component terminal 123 provided at a bottom side of semiconductor component 12. In some examples, component terminal 121 can comprise or be referred to as a source terminal (or a drain terminal). In some examples, component terminal 122 can comprise or be referred to as a gate terminal (or a control terminal). In some examples, component terminal 123 can comprise or be referred to as a drain terminal (or a source terminal). In some examples, electrical current can flow or can be prevented from flowing from the source terminal to the drain terminal (or vice versa) by a control signal supplied to the gate terminal. In some examples, semiconductor component 12 can have an area ranging from approximately 1 mm×1 mm to approximately 10 mm×10 mm. In some examples, semiconductor component 12 can have a thickness ranging from approximately 50 μm to approximately 775 μm. In some examples, component terminal 123 of semiconductor component 12 can contact interface material 14A. In some examples, interface material 14A can be supplied with heat and then cooled, and thus substrate terminal 113 can be coupled to component terminal 123 of semiconductor component 12 through interface material 14A. In some examples, substrate 11 can be placed into a reflow furnace or a laser assist bonding apparatus, thereby applying approximately 150° C. to approximately 400° C. to interface material 14A. Thereafter, cooling is performed, thereby coupling semiconductor component 12 to substrate terminal 113 through interface material 14A.

FIG. 2D shows a cross-sectional view and plan view of semiconductor device 10 at a later stage of manufacture. In the example shown in FIG. 2D, interface materials 14B and 14C can be provided on semiconductor component 12. In some examples, interface materials 14B and 14C can be arranged on component terminals 121 and 122 of semiconductor component 12, respectively. In some examples, interface materials 14D and 14E can be provided on substrate terminals 111 and 112, respectively. In some examples, interface materials 14B, 14C, 14D and 14E can comprise or be referred to as a solder, a conductive adhesive or a conductive paste, or can be similar to interface material 14A. In some examples, interface materials 14B, 14C, 14D and 14E can be provided on component terminals 121 and 122 and substrate terminals 111 and 112 by coating or by dispensing in the form of a paste. In some examples, interface materials 14B, 14C, 14D and 14E can have a thickness ranging from approximately 5 µm to approximately 100 µm. In some examples, interface materials 14B and 14C on component terminals 121 and 122 of semiconductor component 12, and interface materials 14E and 14D on substrate terminals 111 and 112, can couple clip structure 15 with substrate terminals 111 and 112 and with component terminals 121 and 122.

FIG. 2E shows a cross-sectional view and plan view of semiconductor device 10 at a later stage of manufacture. In the example shown in FIG. 2E, clip structure 15 can be provided on component terminals 121 and 122 of semiconductor component 12, and on substrate terminals 111 and 112 of substrate 11. In some examples, clip structure 15 can comprise or be referred to as a conductive bridge, a conductive connector, a conductive bar, or a conductive interface. In some examples, clip structure 15 can comprise copper (Cu), Cu alloy, iron (Fe), Fe alloy, or Fe—Ni alloy. In some examples, clip structure 15 can comprise a coating layer or plating provided on a side of clip structure 15, such as nickel (Ni), palladium (Pd), gold (Au), silver (Ag), or solder (Sn). In some examples, clip structure 15 can be formed using a material similar to that of substrate 11, or can be formed in a similar manner as the substrate 11. In some examples, clip structure 15 can be provided through etching or stamping.

In some examples, clip structure 15 can comprise a substantially H shape in a plan view. In some examples, clip structure 15 can comprise clips 151 and 152 and clip joint 155. In some examples, clip joint 155 can comprise clip legs 1551 and 1552 coupled to clips 151 and 152, respectively. In some examples, clips 151 and 152 can be coupled to each other by clip joint 155, clip leg 1551, and clip leg 1552. In some examples, clip joint 155 can have a greater height than clip 151, clip 152, clip leg 1551, or clip leg 1552. In some examples, opposite ends of clip joint 155 can be coupled to clips 151 and 152 through clip legs 1551 and 1552, respectively. In some examples, clip legs 1551 and 1552 can be provided between clip joint 155 and clips 151 and 152 in an inclined shape that raises clip joint 155 relative to clips 151 and 152. In some examples, because higher electrical current (e.g., source-drain current) can flow through clip 151, and lower electrical current (e.g., a gate control signal) can flow through clip 152, clip 151 can have a relatively larger width or area than clip 152. In some examples, clip joint 155 can also be referred to as a sacrificial portion that is intended, for example, to be removed in a final semiconductor package. In other examples, clip 151 and clip 152 can have the same or equal widths or areas, for example if both clips are configured to have similar current load capabilities, or to meet other package design requirements.

In some examples, one end of clip 151 can be coupled to semiconductor component 12, and the other end of clip 151 can be coupled to substrate terminal 111. In some examples, one end of clip 151 can be coupled to interface material 14B provided on component terminal 121 of semiconductor component 12, and the other end of clip 151 can be coupled to interface material 14D provided on substrate terminal 111. In some examples, clip 151 can be provided to have an inclined or stepped shape extending from semiconductor component 12 to substrate terminal 111. In some examples, the one end of clip 151 coupled to semiconductor component 12 can be referred to as a component-attached region and the other end of claim 151 coupled to substrate terminal 111 can be referred to as a substrate-attached region.

In some examples, one end of clip 152 can be coupled to semiconductor component 12, and the other end of clip 152 can be coupled to substrate terminal 112. In some examples, one end of clip 152 can be coupled to interface material 14C provided on component terminal 122 of semiconductor component 12, and the other end of clip 152 can be coupled to interface material 14E provided on substrate terminal 112. In some examples, clip 152 can be provided to have an inclined or stepped shape extending from semiconductor component 12 to substrate terminal 112. In some examples, the one end of clip 152 coupled to semiconductor component 12 can be referred to as a component-attached region and the other end of claim 152 coupled to substrate terminal 112 can be referred to as a substrate-attached region.

Specific shapes of clip structure 15 can be dependent on shapes or positions of substrate terminals 111, 112 and 113. In some examples, clip structure 15 can have a width ranging from approximately 200 µm to approximately 9500 µm, or a thickness ranging from approximately 100 µm to approximately 500 µm. In some examples, clip 151 or 152 can have a width ranging from approximately 200 µm to approximately 9500 µm, or a thickness ranging from approximately 100 µm to approximately 500 µm.

In some examples, a top side of clip joint 155 can be approximately 300 µm to approximately 1300 µm higher than other regions excluding clip legs 1551 and 1552. Clip joint 155 can have a thickness ranging from approximately 100 µm to approximately 500 µm. In some examples, clip legs 1551 and 1552 can have a width ranging from approximately 200 µm to approximately 1000 µm, and clip legs 1551 and 1552 can have a thickness ranging from approximately 100 µm to approximately 500 µm.

In some examples, interface materials 14B, 14C, 14D and 14E can be supplied with heat and then cooled, and thus clip structure 15 can be coupled to substrate terminals 111 and 112 and component terminals 121 and 122 of semiconductor component 12 through interface materials 14B, 14C, 14D and 14E. In some examples, substrate 11 comprising clip structure 15 and interface materials 14B, 14C, 14D and 14E can be placed into a reflow furnace or a laser assist bonding apparatus, thereby applying a temperature of approximately 150° C. to approximately 400° C. to clip structure 15 and interface materials 14B, 14C, 14D and 14E. Thereafter, interface materials 14B, 14C, 14D and 14E can be cooled, and thus clip structure 15 and semiconductor component 12 can be coupled to each other through interface materials 14B, 14C, 14D and 14E.

In some examples, a melting point of interface material 14A between semiconductor component 12 and substrate terminal 113 can be higher than interface materials 14B, 14C, 14D and 14E between semiconductor component 12 and clip structure 15 or clip structure 15 and substrate terminals 111 and 112. When clip structure 15 is coupled to semiconductor component 12 and substrate terminals 111 and 112 through interface materials 14B, 14C, 14D and 14E, interface materials 14B, 14C, 14D and 14E, except for interface material 14A, can be melted. Accordingly, while clip structure 15 is coupled to semiconductor component 12 and substrate terminals 111 and 112, semiconductor component 12 can be prevented from rotating or shifting on substrate terminal 113. Adjusting of such melting point can be achieved by adjusting the content of solders in interface materials or varying kinds or composition ratios of alloys.

Figure 2F:
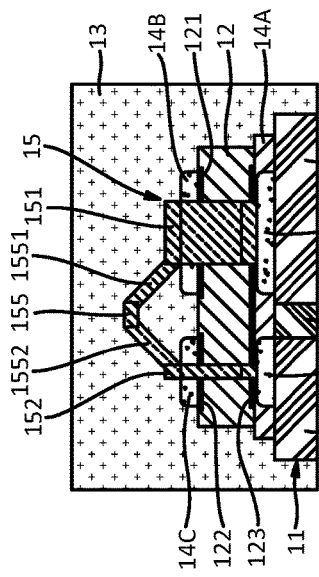
Figure 2F:
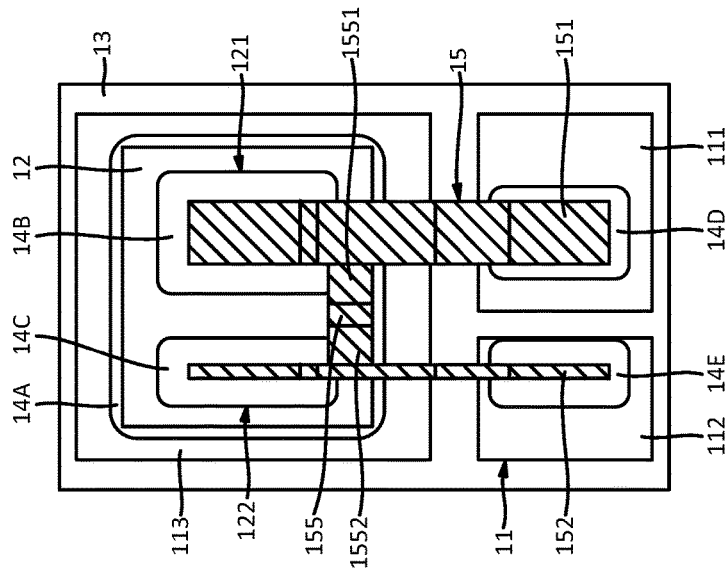

FIG. 2F shows a cross-sectional view and x-ray plan view of semiconductor device 10 at a later stage of manufacture. In the example shown in FIG. 2F, encapsulant 13 can be provided on substrate 11, semiconductor component 12 and clip structure 15. Encapsulant 13 can contact substrate 11, semiconductor component 12 and clip structure 15, or can encapsulate substrate 11, semiconductor component 12 and clip structure 15. As seen in FIG. 2F, encapsulant 13 can be applied to fully cover clip structure 15. There can be examples where a portion of clip structure 15, such as clip joint 155, can remain exposed from encapsulant 13. In some examples, a region of substrate 11 can be exposed through encapsulant 13. In some examples, bottom sides of substrate terminals 111, 112 and 113 can be exposed at a bottom side of encapsulant 13. In some examples, the bottom side of encapsulant 13 can be coplanar with the bottom sides of substrate terminals 111, 112 and 113.

Encapsulant 13 can comprise or be referred to as a mold compound, a resin, a sealant, a filler-reinforced polymer, or a package body. In some examples, encapsulant 13 can comprise an epoxy or phenol resin, carbon black and a silica filler. In some examples, encapsulant 13 can be provided by compression molding, transfer molding, liquid encapsulant molding, vacuum lamination, paste printing or film assist molding. The compression molding can be performed by supplying a flowable resin to a mold in advance, placing a substrate into the mold and then curing the flowable resin, and the transfer molding can be performed by supplying a flowable resin to a gate (supply port) of a mold and to surroundings of a pertinent substrate and then curing the flowable resin. Encapsulant 13 can have a width ranging from approximately 3 mm×3 mm to approximately 15 mm×15 mm, and a thickness ranging from approximately 0.7 mm to approximately 2.1 mm. Encapsulant 13 can provide protection for a semiconductor component from external elements or environmental exposure and can rapidly emit heat generated from the semiconductor component outward.

FIG. 2G shows a cross-sectional view and x-ray plan view of semiconductor device 10 at a later stage of manufacture. In the example shown in FIG. 2G, encapsulant 13 can be thinned, for example, by grinding with a grinder. In some examples, a top side of encapsulant 13 can be thinned until clip joint 155 is removed to disconnect clip 151 and clip 152 from each other. In some examples, clip joint 155 can be grinded or removed while encapsulant 13 is thinned. In some examples, clip joint 155 can be cut with a mechanical or laser saw. With clip joint 155 removed, clips 151 and 152 are physically and electrically disconnected from each other. In some examples, source-drain current can then independently flow through clip 151, and a gate control signal can be independently transmitted through clip 152. As illustrated in FIG. 2G, after clip joint 155 is removed, a gap 155A or space 155A is interposed between clip leg 1552 and clip leg 1551.

In some examples, after the grinding, top sides of clip legs 1551 and 1552 can remain exposed at the top side of encapsulant 13. In some examples, the grinding can continue until clip legs 1551 and 1552 are also removed. In some examples, after the grinding, top sides of clips 151 and 152 can be exposed at the top side of encapsulant 13. In some examples, the grinding or removal of clip joint 155 can comprise a stage, features or elements similar to those described with respect to FIG. 7A-7C.

In some examples, the stages above can be followed by performing general plating, marking, singulating and shipping. In some examples, the plating can comprise supplying an oxidation resistant film to clip legs 1551 and 1552, clips 151 and 152, or substrate terminals 111, 112 and 113, exposed from the top side or the bottom side of encapsulant 13. In some examples, the oxidation resistant film can comprise gold (Au), silver (Ag), nickel (Ni), palladium (Pd), solder (Sn), or organic solderability preservative (OSP). In some examples, active elements, such as a semiconductor die, an electronic component, or passive elements such as an inductor or a capacitor, can be mounted on clip legs 1551 and 1552 or clips 151 and 152 exposed from encapsulant 13. The marking can comprise marking a product name or a manufacturer's name on a side of encapsulant 13. The singulating can comprise separating semiconductor devices fabricated in a matrix or stripe configuration having multiple rows or columns into individual semiconductor devices by sawing/cutting. The shipping can comprise placing the individual semiconductor devices into an antistatic tray.

According to the present disclosure, even if semiconductor device 10 or clip structure 15 is small or narrow, clip structure 15 on semiconductor component 12 can be prevented from falling over or shifting during the manufacture of semiconductor device 10 because of the stability provided by clip joint 155 tying or coupling clips 151 and 152 together. In some examples, during the manufacture of semiconductor device 10, clip structure 15 having a substantially H-shaped configuration can be provided, and clip structure 15 can be divided into individual clips by grinding or grooving after the encapsulating, thereby providing clip structure 15 at accurate positions between semiconductor component 12 and substrate terminals 111 and 112. In some examples, active elements or passive elements can be mounted on clips 151 and 152 exposed through encapsulant 13, and thus application ranges of semiconductor device 10 can be extended.

Figure 3C:
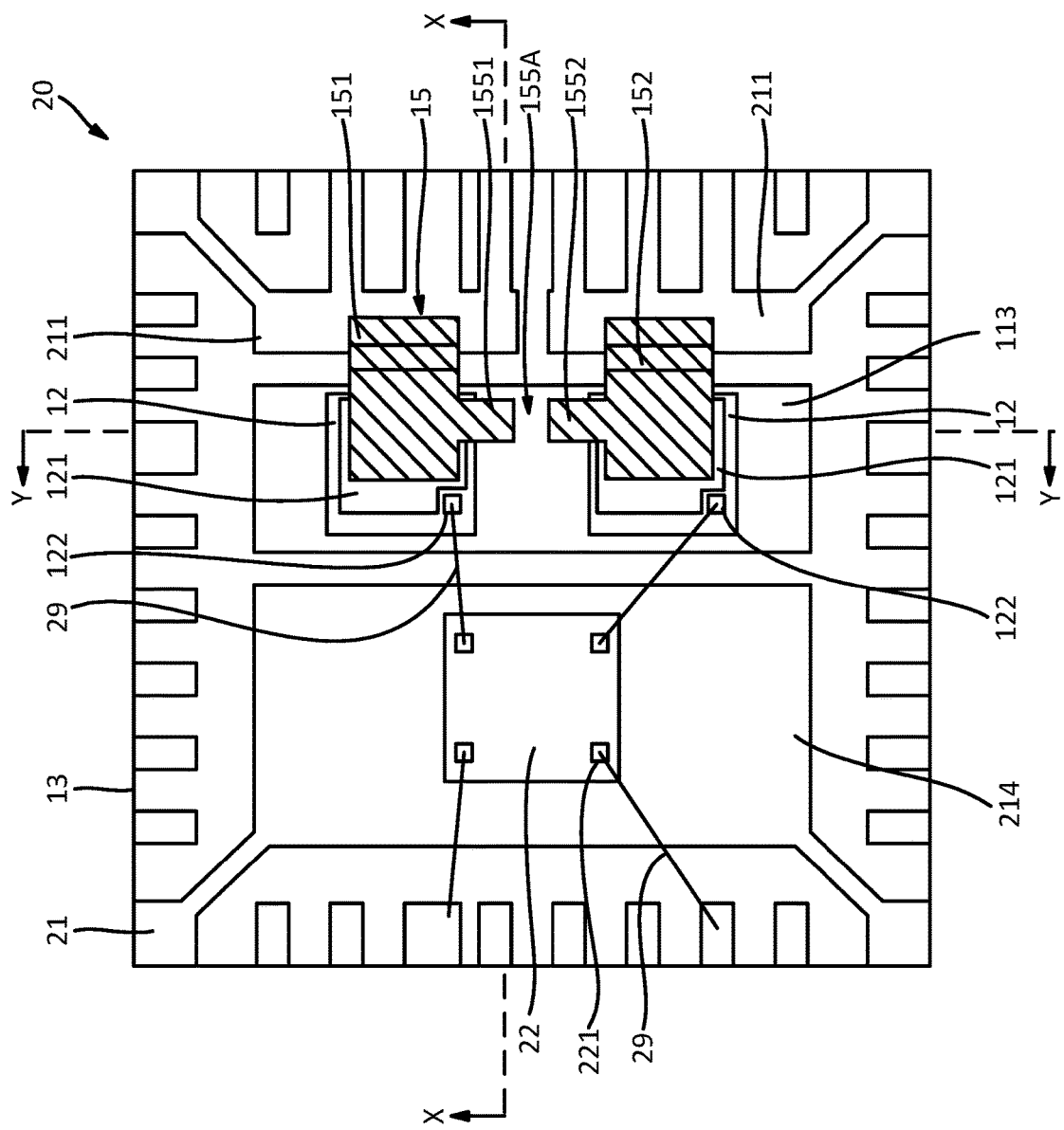

FIGS. 3A and 3B show cross-sectional views of an example semiconductor device 20 and FIG. 3C shows an x-ray plan view of an example semiconductor device 20. FIG. 3A is a cross-sectional view taken along line Y-Y of FIG. 3C, and FIG. 3B is a cross-sectional view taken along line X-X of FIG. 3C. In the example shown in FIGS. 3A to 3C, semiconductor device 20 can comprise substrate 21, semiconductor component 12 and 22, encapsulant 13, interface materials 14A, 14B, 14C and 14D, clip structure 15 and interconnect 29. Substrate 21 can comprise substrate terminals 211, 113 and 214. Semiconductor device 20 can be similar to the above-described semiconductor device 10 in terms of features, elements, or manufacturing. As illustrated in FIG. 3C, after clip joint 155 is removed, gap 155A is interposed between clip leg 1552 and clip leg 1551.

FIGS. 4A, 4B, 4C, 4D, 4E, 4F, 4G, 4H, and 4I show cross-sectional views and plan views of an example method for manufacturing semiconductor device 20. In the following, reference is made to FIGS. 3A, 3B, and 3C together.

Figure 4A:
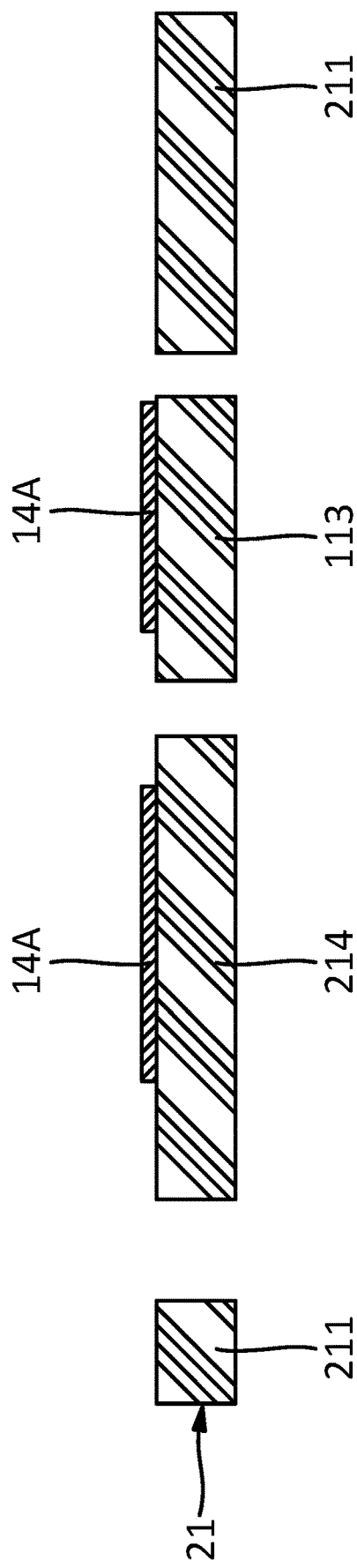

FIG. 4A shows a cross-sectional view of semiconductor device 20 at an early stage of manufacture. In the example shown in FIG. 4A, substrate 21 can be provided. Interface materials 14A can be provided on substrate terminals 113 and 214, similar to as described with respect to interface material 14A for FIG. 2B.

In some examples, substrate 21 can be similar to substrate 11. Substrate 21 can comprise substrate terminals 211, 113 and 214. Substrate terminals 211 can be arranged at peripheral edges of substrate terminals 113 and 214. In some examples, multiple substrate terminals 211 can be arranged at one side of a substrate terminal 113. In some examples, multiple substrate terminals 211 can be arranged at three side sides of substrate terminals 113 or 214. In some examples, substrate terminal 211 can comprise or be referred to as one or more leads. In some examples, substrate terminals 113 or 214 can comprise or be referred to a leads, pads, paddles or flags.

In some examples, substrate 21 can have a width ranging from approximately 3 mm×3 mm to approximately 15 mm×15 mm. In some examples, substrate 21 can have a thickness ranging from approximately 100 µm to approximately 200 µm. In some examples, substrate terminals 211 can have a width ranging from approximately 1 mm×1 mm to approximately 10 mm×10 mm. In some examples, substrate terminals 211 can have a thickness ranging from 100 µm to approximately 200 µm. An area of substrate terminal 214 can be dependent on the size of semiconductor component 22, and in some examples substrate terminal 214 can have an area ranging from approximately 1.5 mm×1.5 mm to approximately 10.5 mm×10.5 mm, or a thickness ranging from approximately 100 µm to approximately 200 µm.

Figure 4B:
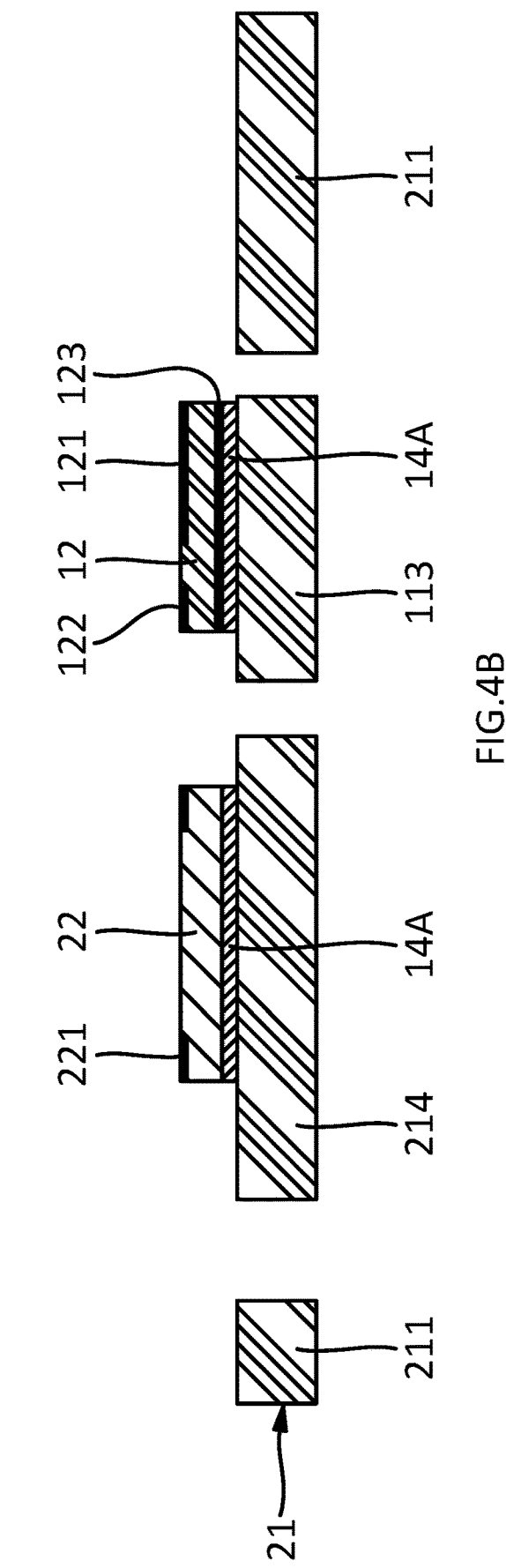

FIG. 4B shows a cross-sectional view of semiconductor device 20 at a later stage of manufacture. In the example shown in FIG. 4B, semiconductor component 12 can be provided on substrate terminal 113. In some examples, the stage, features, or elements of FIG. 4B can be similar to those described with respect to semiconductor component 12 for FIG. 2C. In some examples, semiconductor component 12 can be arranged on interface material 14A. Semiconductor component 12 can comprise component terminals 121 and 122 at a top side of semiconductor component 12, and component terminal 123 at a bottom side of semiconductor component 12.

In some examples, semiconductor component 22 can be provided on substrate terminal 214. In some examples, semiconductor component 22 can be arranged on interface material 14A. In some examples, semiconductor component 22 can comprise or be referred to as a controller, a digital signal processor (DSP), a microprocessor, a network processor, a power management processor, an audio processor, an RF circuit, a wireless baseband system-on-chip (SoC) processor, a sensor, or an application specific integrated circuit (ASIC). In some examples, semiconductor component 22 can have an area ranging from approximately 1 mm×1 mm to approximately 10 mm×10 mm. In some examples, semiconductor component 22 can have a thickness ranging from 50 µm to approximately 775 µm. In some examples, semiconductor component 22 can comprise multiple terminals 221 located on a top side of semiconductor component 22. In some examples, interface material 14A is melted or cured to couple semiconductor components 12 and 22 to substrate terminals 113 and 214 respectively.

Figure 4C:
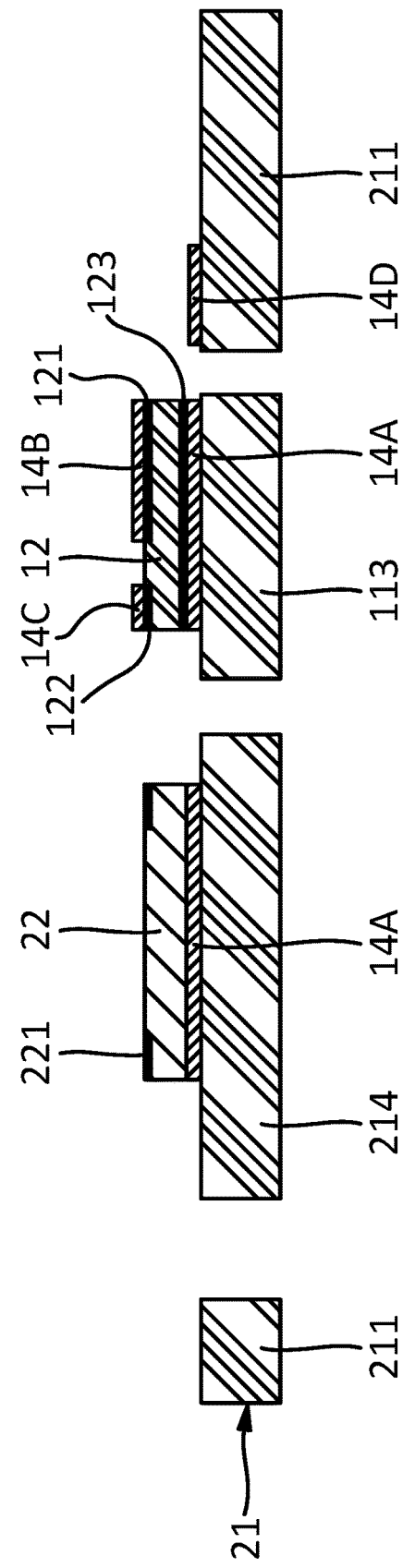

FIG. 4C shows a cross-sectional view of semiconductor device 20 at a later stage of manufacture. In the example shown in FIG. 4C, interface materials 14B, 14C, and 14D can be provided. In some examples, interface materials 14B, 14C, or 14D can be applied similar to as described with respect to FIG. 2D. In some examples, interface material 14B and 14C can be respectively provided on component terminal 121 and 122 of semiconductor component 12. In some examples, interface material 14D can be provided on substrate terminals 211 of substrate 21.

Figure 4D:
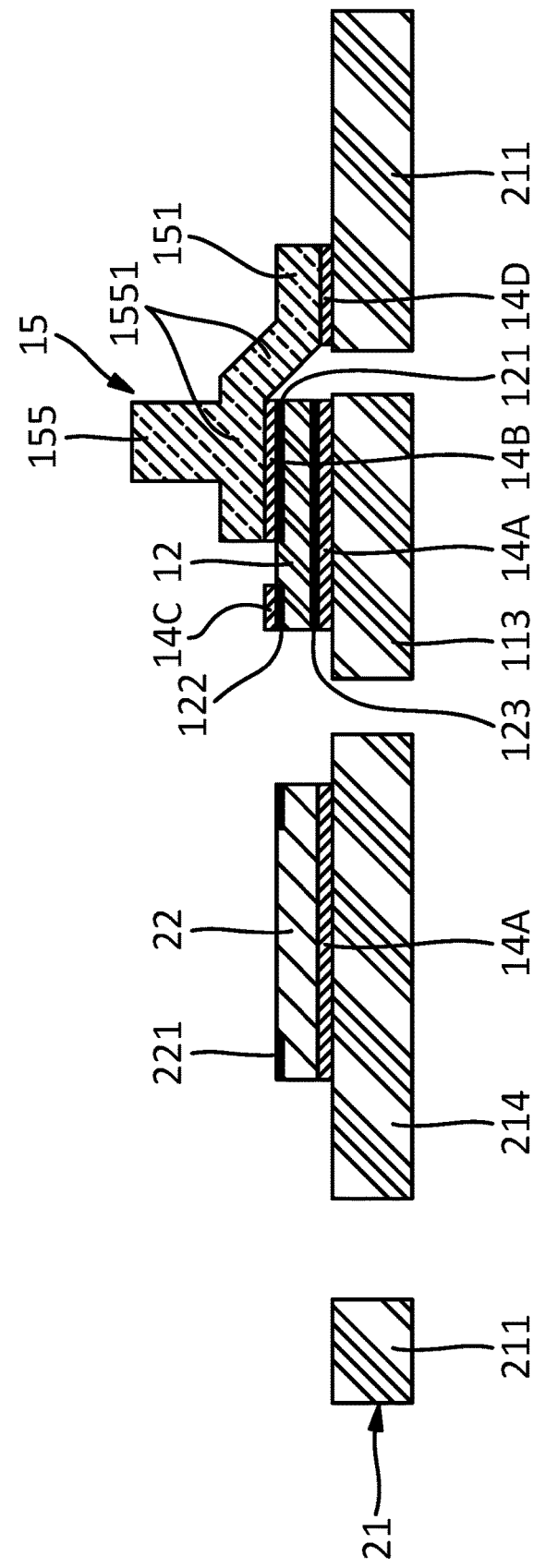

FIG. 4D shows a cross-sectional view of semiconductor device 20 at a later stage of manufacture. In the example shown in FIG. 4D, clip structure 15 can be provided on semiconductor component 12 and substrate terminal 211. In some examples, the stage, features, or elements of FIG. 4D can be similar to those described with respect to clip structure 15 for FIG. 2E.

In some examples, clip structure 15 can comprise clips 151 and 152 (see FIG. 3C) and clip joint 155. In some examples, clip joint 155 can comprise clip legs 1551 and 1552 (see FIG. 3C). Clips 151 and 152 can be coupled to each other by clip joint 155. In some examples, clip joint 155 can have a greater height than clips 151 and 152. In some examples, opposite ends of clip joint 155 can be coupled to clips 151 and 152 through clip legs 1551 and 1552, respectively. In some examples, clip legs 1551 and 1552 can be provided between clip joint 155 and clips 151 and 152 in an inclined shape.

In some examples, first ends of clips 151 and 152 can be coupled to semiconductor component 12, and second ends of clips 151 and 152 can be coupled to substrate terminal(s) 211. In some examples, the first ends of clips 151 and 152 can be coupled to interface material 14B provided on component terminal 121 of semiconductor component 12, and the second ends of clips 151 and 152 can be coupled to interface material 14D provided on substrate terminal 211. In some examples, clips 151 and 152 can be provided in an inclined or stepped shape extending from semiconductor component 12 to substrate terminal(s) 211. In some examples, the first ends of clips 151 and 152 can be referred to as component-attached regions. In some examples, the second ends of clips 151 and 152 can be referred to as substrate-attached regions.

FIG. 4E shows a cross-sectional view of semiconductor device 20 at a later stage of manufacture. In the example shown in FIG. 4E, a reflow process can be performed. The reflow process can comprise placing substrate 21 into a reflow furnace or a laser assist bonding device to apply a temperature of approximately 150° C. to approximately 400° C. Thereafter, substrate 21 can be cooled and thus melted interface materials 14B and 14D can be cooled, thereby coupling substrate terminal 211 and component terminal 121 of semiconductor component 12 to each other through clip structure 15.

FIG. 4F shows a cross-sectional view of semiconductor device 20 at a later stage of manufacture. In the example shown in FIG. 4F, cleaning can be performed. The cleaning can comprise removing residuals of interface materials or removing a variety of particles remaining on substrate 11, semiconductor component 12 and 22, and clip structure 15. In some examples, the cleaning can comprise a variety of processes including, for example, spraying a washing solution onto substrate 11, soaking substrate 21 into a washing solution tank, or ultrasonically washing.

FIG. 4G shows a cross-sectional view of semiconductor device 20 at a later stage of manufacture. In the example shown in FIG. 4G, interconnects 29 can be provided. In some examples, semiconductor component 12 and semiconductor component 22 can be coupled to each other by interconnect 29, and semiconductor component 22 and substrate terminal 211 can be coupled to each other by interconnect 29. In some examples, terminal 221 of semiconductor component 22 and component terminal 122 (e.g., a gate terminal) of semiconductor component 12 can be bonded to each other by interconnect 29. In some examples, terminal 221 of semiconductor component 22 and substrate terminal 211 can be bonded to each other by interconnect 29. In some examples, a first end of interconnect 29 can be ball-bonded to terminal 221 of semiconductor component 22, and a second end of interconnect 29 can be stitch-bonded to component terminal 122 of semiconductor component 12, or vice versa. In some examples, the first end of interconnect 29 can be ball-bonded to terminal 221 of semiconductor component 22, and the second end of interconnect 29 can be stitch-bonded to substrate terminal 211, and vice versa. In some examples, interconnect 29 can comprise or be referred to as a conductive wire or a bonding wire. In some examples, interconnect 29 can have a diameter ranging from approximately 15 µm to approximately 30 µm. Interconnect 29 can transfer an electrical signal (e.g., a control signal) from semiconductor component 22 to semiconductor component 12.

FIG. 4H shows a cross-sectional view of semiconductor device 20 at a later stage of manufacture. In the example shown in FIG. 4H, encapsulant 13 can be provided on substrate 21, semiconductor component 12 and 22, and clip structure 15. In some examples, the stage, features, or elements of FIG. 4H can be similar to those described with respect to encapsulant 13 for FIG. 2F. Encapsulant 13 can contact substrate 21, semiconductor component 12 and 22, and clip structure 15, or can encapsulate substrate 21, semiconductor component 12 and 22, and clip structure 15. As seen in FIG. 4H, encapsulant 13 can be applied to fully cover clip structure 15. There can be examples where a portion of clip structure 15, such as clip joint 155, can remain exposed from encapsulant 13.

Figure 4I:
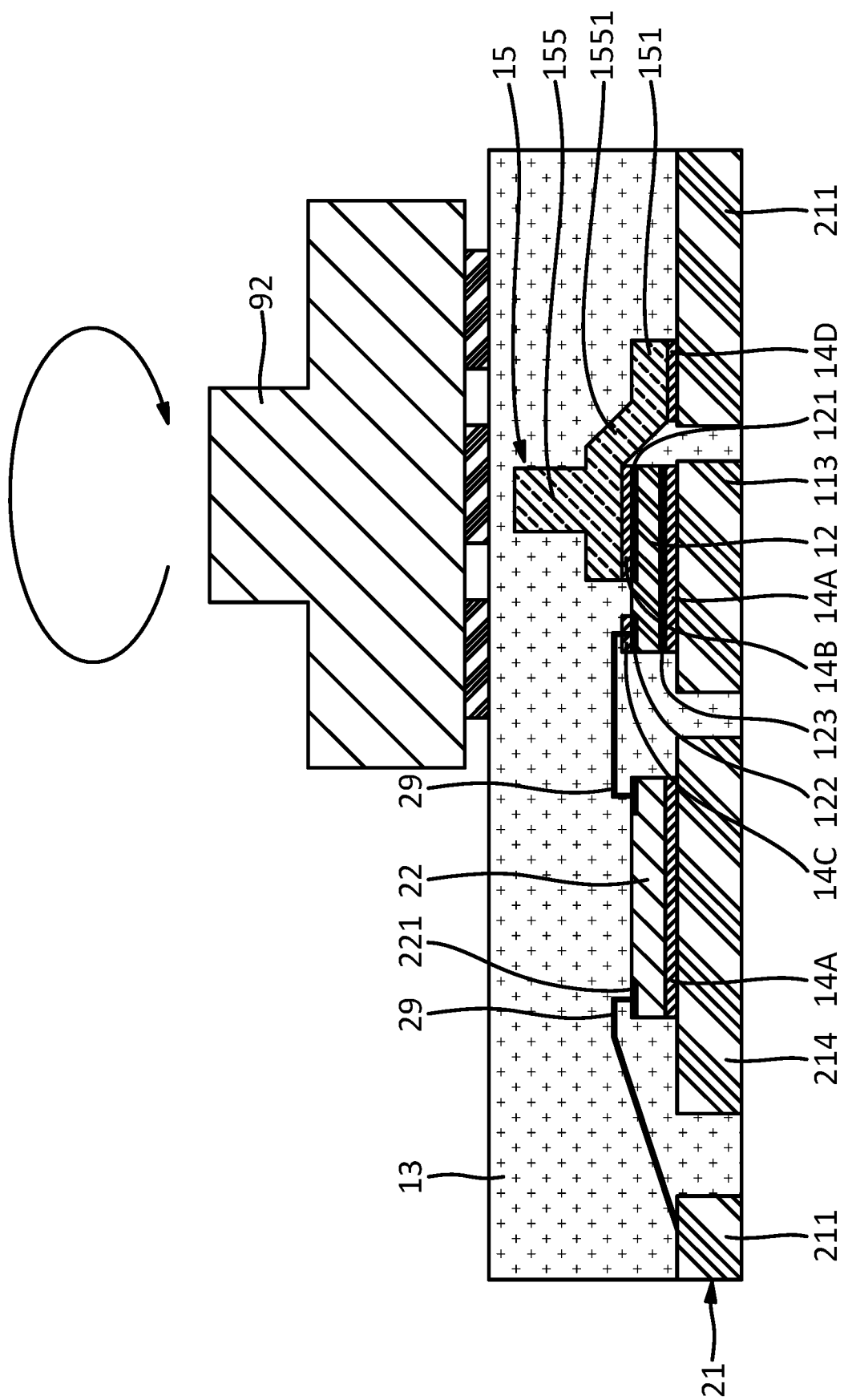

FIG. 4I shows a cross-sectional view of semiconductor device 20 at a later stage of manufacture. In the example shown in FIG. 4I, thinning can be performed. In some examples, the stage, features, or elements of FIG. 4I can be similar to those described with respect to thinning for FIG. 2G. In some examples, a top side of encapsulant 13 can be thinned until clip joint 155 is removed to disconnect clip 151 and clip 152 from each other. In some examples, clip joint 155 can be grinded or removed while encapsulant 13 is thinned. In some examples, clip joint 155 can be cut with a mechanical or laser saw. With clip joint 155 removed, clips 151 and 152 are physically and electrically disconnected from each other. In some examples, source-drain current can then independently flow through clip 151, and source-drain current can then independently flow through clip 152.

Figure 5A:
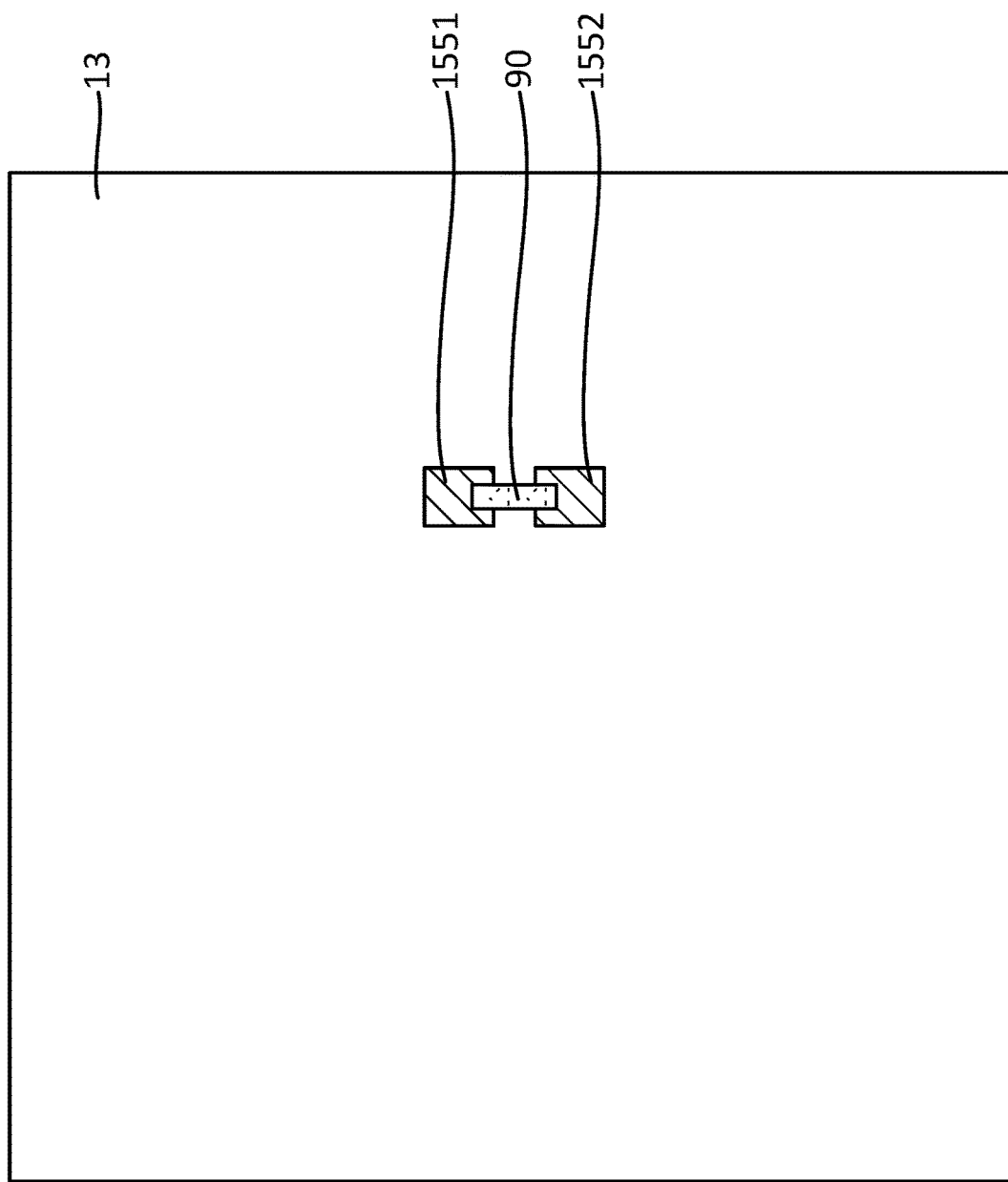
FIGS. 5A and 5B show plan view and cross-sectional view of an example method for manufacturing an example semiconductor device.
Figure 5B:
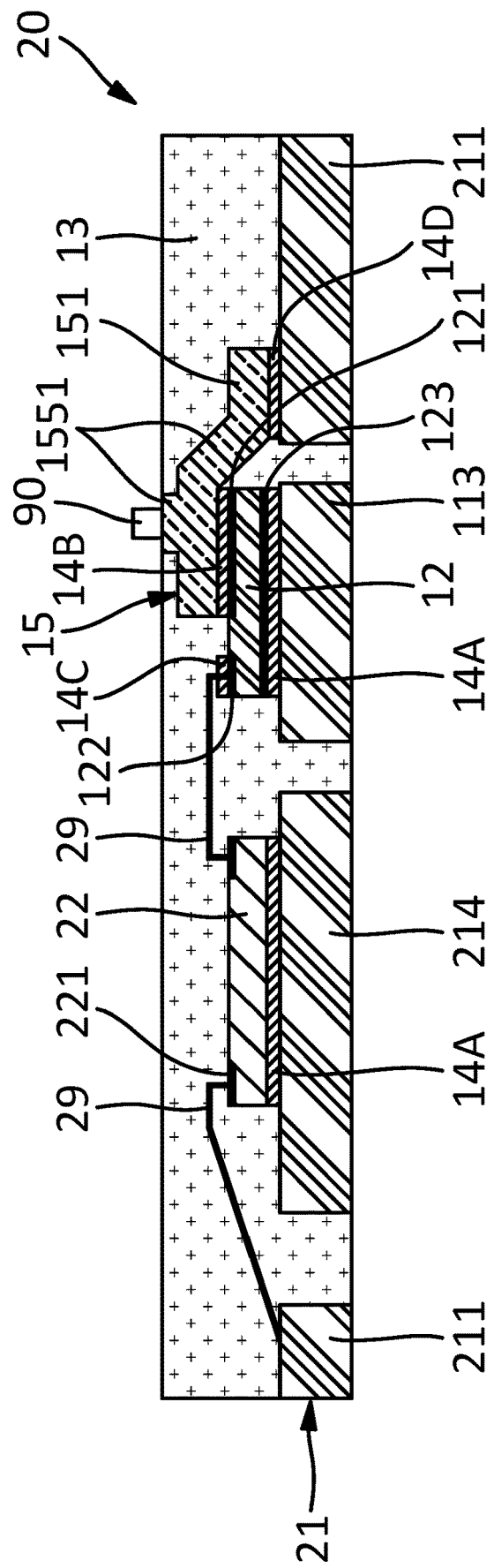

FIGS. 5A to 5B show plan view and cross-sectional view of an example method for manufacturing example semiconductor device 20. In the example shown in FIGS. 5A and 5B, after the grinding, clip legs 1551 and 1552 can be exposed at the top side of encapsulant 13. In some examples, an oxidation resistant film made of gold (Au), silver (Ag), nickel, (Ni), palladium (Pd), solder (Sn), or organic solderability preservative (OSP) can be provided on clip legs 1551 and 1552. In some examples, component 90 can be mounted on clip legs 1551 and 1552. In some examples component 90 can comprise active elements, such as a semiconductor die, or passive elements such as an inductor or a capacitor.

Figure 6A:
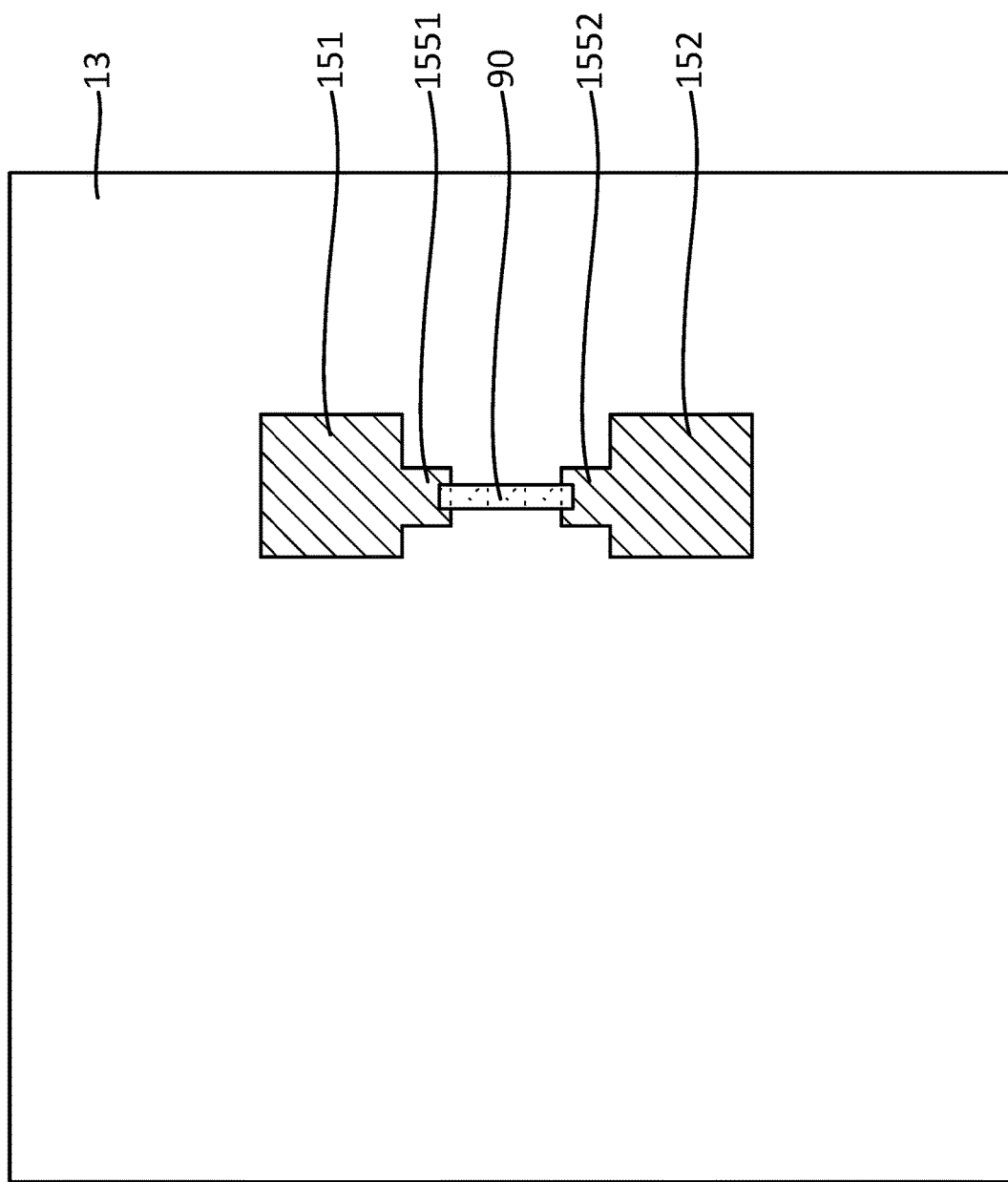
FIGS. 6A and 6B show plan view and cross-sectional view of an example method for manufacturing an example semiconductor device.
Figure 6B:
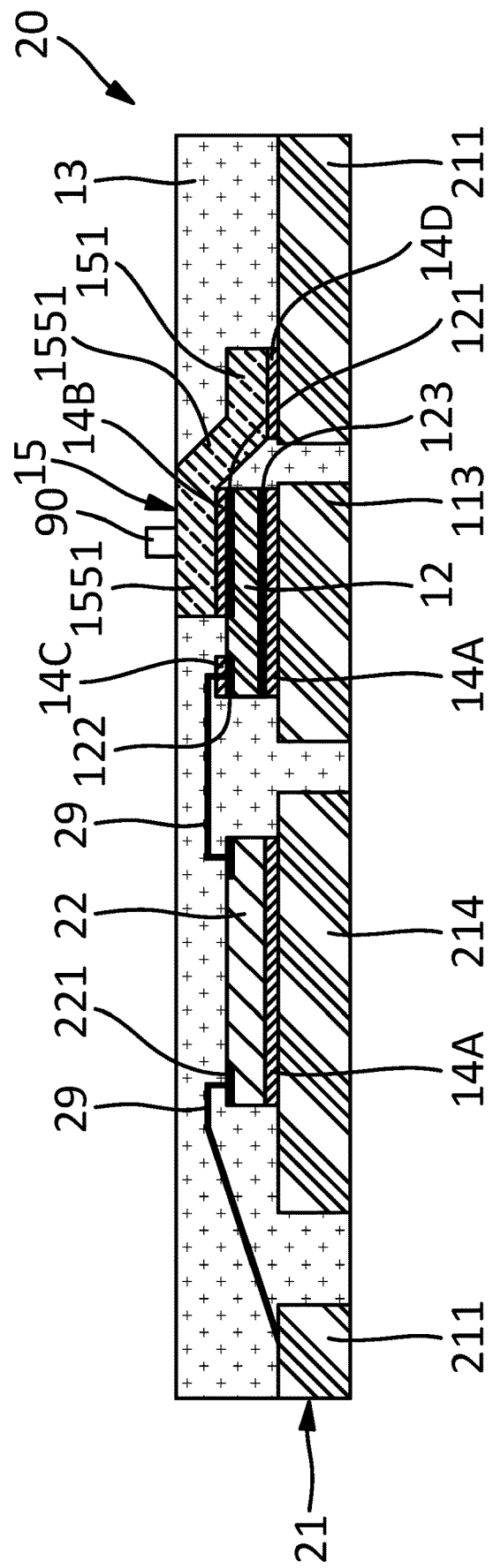

FIGS. 6A to 6B show plan view and cross-sectional view of an example method for manufacturing example semiconductor device 20. In the example shown in FIGS. 6A and 6B, after the grinding, clips 151 and 152 or clip legs 1551 and 1552 can be exposed at the top side of encapsulant 13. Note that in some examples the grinding can continue until clip legs 1551 and 1552 are completely removed, such that only clips 151 and 152 are exposed at the top side of encapsulant 13. In some examples, an oxidation resistant film made of gold (Au), silver (Ag), nickel, (Ni), palladium (Pd), solder (Sn), or organic solderability preservative (OSP) can be provided on clips 151 and 152 or clip legs 1551 and 1552.

In some examples, component 90 can be mounted on clip legs 1551 and 1552 or clips 151 and 152. In some examples component 90 can comprise active elements, such as a semiconductor die, electronic components, or passive elements such as an inductor or a capacitor.

Figure 7B:
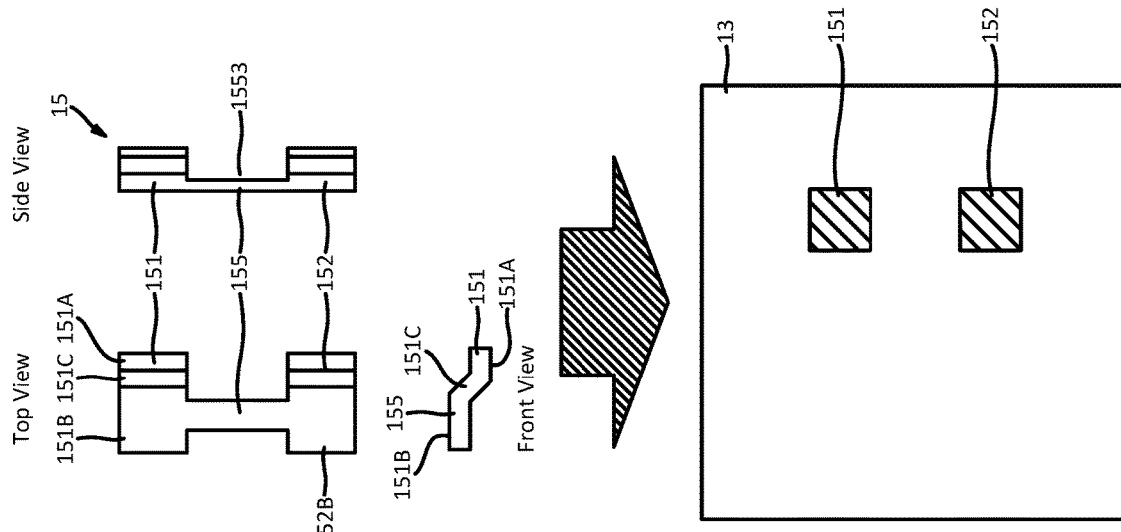
Figure 7A:
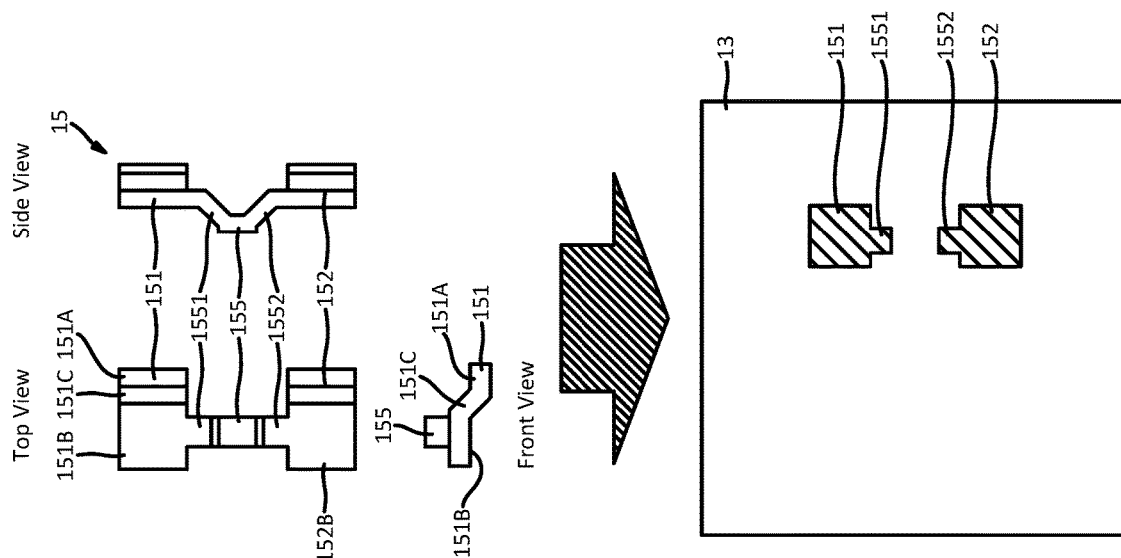

FIGS. 7A to 7C show top view, side view and front view of portions of example methods for manufacturing semiconductor device 10 or 20.

In some examples, as illustrated in FIG. 7A, clip structure 15 can comprise clips 151 and 152 positioned adjacent each other, with clip joint 155 positioned between clips 151 and 152, with clip leg 1551 coupling clip 151 with clip joint 155, and with clip leg 1552 coupling the clip 152 with clip joint 155. Clip legs 1551 and 1552 can extend inclined between clip joint 155 and respective clips 151-152. A top of clip joint 155 can be higher than the top of clips 151 and 152, or higher than midpoints of clip legs 1551 and 1552.

In some examples, clips 151 and 152 can also comprise inclined portions. For instance, clip 151 can comprise substrate-attached region 151A positioned lowest coupled to substrate terminal 111 or 211, component-attached region 151B positioned highest coupled to semiconductor component 12, and inclined region 151C coupling substrate-attached region 151A with component-attached region 151B.

After encapsulating with encapsulant 13, clip joint 155 can be removed. In some examples, such removal of clip joint 155 can correspond or be similar to the stages described with respect to FIG. 2F-2G, 4H-4I, 5A-5B, or 6A-6B. In some examples clip joint 155 can be grinded to disconnect clips 151 and 152 from each other, with clip legs 1551 and 1552 or clips 151 and 152 remaining exposed at the top side of encapsulant 13. In some examples, component 90 can be mounted on exposed clip legs 1551 and 1552 or exposed clips 151 and 152.

In some examples, as shown in FIG. 7B, clip structure 15 can comprise clips 151 and 152 positioned adjacent each other, with clip joint 155 positioned between clips 151 and 152. Clip legs 1551 and 1552 can be optional in the present example or can be considered part of clip joint 155. In the present example, without clip legs 1551 and 1552 inclined, the top of clip joint 155 can be coplanar with or at similar height as the top of clips 151 or 152.

In some examples, clip joint 155 can initially tie together component-attached regions 151B and 152B of clips 151 and 152. In some examples, clip joint 155 can be substantially coplanar with component attached region 151B. In some examples, clip joint 155 and can comprise a thin region or groove 1553 at the bottom of clip joint 155.

After encapsulating with encapsulant 13, clip joint 155 can be removed. In some examples, such removal of clip joint 155 can correspond or be similar to the stages described with respect to FIG. 2F-2G, 4H-4I, 5A-5B, or 6A-6B. In some examples clip joint 155 can be grinded until removed, such as by grinding to reach or expose groove 1553, thus disconnecting clips 151 and 152 from each other, with clips 151 and 152 remaining exposed at the top side of encapsulant 13. In some examples, component 90 can be mounted on exposed clips 151 and 152.

In some examples, as illustrated in FIG. 7C, clip structure 15 can comprise clips 151 and 152 positioned adjacent each other, with clip joint 155 positioned between clips 151 and 152. Clip legs 1551 and 1552 can be optional in the present example or can be considered part of clip joint 155. In the present example, without clip legs 1551 and 1552 inclined, the top of clip joint 155 can be coplanar with or at similar height as the top of clips 151 or 152. In some examples, clip structure 15 of FIG. 7C can initially be similar to the clip structure of FIG. 7A or 7B.

After encapsulating with encapsulant 13, clip joint 155 can be removed. In some examples, such removal of clip joint 155 can correspond or be similar to the stages described with respect to FIG. 2F-2G, 4H-4I, 5A-5B, or 6A-6B. In some examples, after the encapsulating with encapsulant 13, clip joint 155 can be removed by partial cutting, such as by sawing with a mechanical or laser saw, whether alone or after grinding. In some examples, clip joint 155 can be cut, thereby separating clips 151 and 152 from each other. In some examples, the partial cutting can be performed linearly across encapsulant 13 and clip joint 155 using a diamond wheel or a laser beam. In some examples, because of the partial cutting, encapsulant 13 can comprise groove 131.

In some examples, partial cutting to remove clip joint 155 can be carried out after grinding to expose clip joint 155. In some examples, during the encapsulation with encapsulant 13, the top of clip structure 15 or clip joint 155 remain be exposed. In some examples, encapsulant 13 can encapsulate a lower region of clip structure 15, except for the top of clip structure 15 or clip joint 155, by film assist molding. After encapsulating, the top side of clip structure 15 can remain exposed even without grinding, and grinding can be omitted. Partial cutting can be performed on the exposed clip joint 155, thereby untying separating clip structure 15 into two clips 151 and 152 from each other. FIGS. 6A, 7A, and 7B show examples where upper surfaces of component-attached regions (e.g., 151B, 152B) of clip structure 15 are exposed from a top side of encapsulant 13.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor device, comprising:
    a substrate comprising substrate terminals;
    a first semiconductor component comprising a first component terminal and a second component terminal adjacent to a first major side of the first semiconductor component;
    a clip structure, comprising:
        a first clip coupled to the first component terminal and a first substrate terminal;
        a second clip coupled to a second substrate terminal;
        a first clip leg extending from the first clip towards the second clip; and
        a second clip leg extending from the second clip towards the first clip, wherein a gap is interposed between the first clip leg and the second clip leg; and
    an encapsulant covering the first semiconductor component, portions of the substate, and portions of the clip structure;
    wherein:
        a top side of the first clip and a top side of the second clip are exposed from a top side of the encapsulant.

2. The semiconductor device of claim 1, wherein:
    the second clip is further coupled to the second component terminal;
    the first clip comprises a first area;
    the second clip comprises a second area; and
    the second area is different than the first area.

3. The semiconductor device of claim 1, wherein:
    the first clip comprises a first component-attached region having an upper surface; and
    the second clip comprises a second component-attached region having an upper surface.

4. The semiconductor device of claim 3, wherein:
    the first clip leg and the second clip leg extend upward such that an upper surface of the first clip leg is above the upper surface of the first component-attached region and an upper surface of the second clip leg is above the upper surface of the second component-attached region;
    the top side of the first clip exposed from the encapsulant comprises the upper surface of the first clip leg; and
    the top side of the second clip exposed from the encapsulant comprises the upper surface of the second clip leg.

5. The semiconductor device of claim 3, wherein:
    an upper surface of the first clip leg and the upper surface of the first component-attached region are coplanar so that the top side of the first clip exposed from the top side of the encapsulant comprises the upper surface of the first component-attached region; and
    an upper surface of the second clip leg and the upper surface of the second component-attached region are coplanar so that the top side second of the second clip exposed from the top side of the encapsulant comprises the upper surface of the second component-attached region.

6. The semiconductor device of claim 1, further comprising:
    a groove extending inward from the top side of the encapsulant and interposed between the first clip and the second clip.

7. The semiconductor device of claim 1, wherein:
    the top side of the encapsulant comprises a ground surface.

8. The semiconductor device of claim 1, wherein:
    the first clip comprises a first area;
    the second clip comprises a second area;
    the second area is equal to the first area; and
    the semiconductor device further comprises an electronic element coupled to one or more of the top side of the first clip or the top side of the second clip.

9. The semiconductor device of claim 1, further comprising:
    a second semiconductor component having a first component terminal and a second component terminal adjacent to a first major side of the second semiconductor component, wherein:
        the second clip is further coupled to the first component terminal of the second semiconductor component; and
        the encapsulant further covers the second semiconductor component.

10. The semiconductor device of claim 9, further comprising:
    a third semiconductor component having a first component terminal, wherein:
        the first component terminal of the third semiconductor component is coupled to the second component terminal of the second semiconductor device; and
        the encapsulant further covers the third semiconductor component.

11. A semiconductor device, comprising:
    a substrate comprising a first substrate terminal, a second substrate terminal, and a third substrate terminal;
    a first semiconductor component having a first major side, a second major side opposite to the first major side, a first component terminal and a second component terminal adjacent to the first major side, wherein the second major side is coupled with the third substrate terminal;

a clip structure comprising:
  a first clip comprising:
    a first component-attached region having an upper surface, the first component-attached region coupled to the first component terminal; and
    a first substrate-attached region coupled to the first component-attached region and the first substrate terminal;
  a second clip comprising:
    a second component-attached region having an upper surface; and
    a second substrate-attached region coupled to the second component-attached region and the second substrate terminal;
  a first clip leg coupled to the first clip between the first clip and the second clip, the first clip leg having a first leg end; and
  a second clip leg coupled to the second clip between the first clip and the second clip, the second clip leg having a second leg end; and
an encapsulant covering the first semiconductor component, portions of the substrate, and portions of the clip structure;
wherein:
  the first clip leg and the second clip leg are separated by a gap; and
  the first leg end and the second leg end are exposed from a major side of the encapsulant.

12. The semiconductor device of claim 11, wherein:
the second component-attached region is coupled to the second component terminal.

13. The semiconductor device of claim 11, further comprising:
a second semiconductor component having a first component terminal adjacent to a first major side of the second semiconductor component, wherein:
  the second component-attached region is coupled to the first component terminal of the second semiconductor component.

14. The semiconductor device of claim 11, wherein:
the first component-attached region comprises a top side;
the second component-attached region comprises a top side; and
the first clip leg and the second clip leg comprise inclines that raise the first leg end above the top side of the first component-attached region and the second leg end above the top side of the second component-attached region.

15. The semiconductor device of claim 11, wherein:
the first component-attached region comprises a top side;
the second component-attached region comprises a top side;
the first leg end and the top side of the first component-attached region are coplanar so that the top side of the first component-attached region is exposed from the major side of the encapsulant; and
the second leg end and the top side of the second component-attached region are coplanar so that the top side of the second component-attached region is exposed from the major side of the encapsulant.

16. A semiconductor device, comprising:
a substrate comprising a first substrate terminal and a second substrate terminal;
a first semiconductor component comprising a first component terminal and a second component terminal adjacent to a first major side of the first semiconductor component;
a second semiconductor component comprising a first component terminal and a second component terminal adjacent to a first major side of the second semiconductor component;
a clip structure, comprising:
  a first clip coupled to the first component terminal of the first semiconductor component and the first substrate terminal; and
  a second clip coupled to the first component terminal of the second semiconductor component and the second substrate terminal;
  and
an encapsulant covering the first semiconductor component, the second semiconductor component, portions of the substate, and portions of the clip structure;
wherein:
  the first clip comprises a top side;
  the second clip comprises a top side;
  the encapsulant comprises a top side; and
  the top side of the first clip and the top side of the second clip are exposed from the top side of the encapsulant.

17. The semiconductor device of claim 16, further comprising:
a third semiconductor component comprising a first component terminal,
wherein:
  the first component terminal of the third semiconductor component is coupled to the second component terminal of the second semiconductor device; and
  the encapsulant further covers the third semiconductor component.

18. The semiconductor device of claim 16, wherein:
the clip structure further comprises:
  a first clip leg extending from the first clip towards the second clip; and
  a second clip leg extending from the second clip towards the first clip, wherein a gap is interposed between the first clip leg and the second clip leg;
  the first clip comprises a first component-attached region having an upper surface; and
  the second clip comprises a second component-attached region having an upper surface.

19. The semiconductor device of claim 18, wherein:
the first clip leg and the second clip leg extend upward such that an upper surface of the first clip leg is above the upper surface of the first component-attached region and an upper surface of the second clip leg is above the upper surface of the second component-attached region;
the top side of the first clip exposed from the encapsulant comprises the upper surface of the first clip leg; and
the top side of the second clip exposed from the encapsulant comprises the upper surface of the second clip leg.

20. The semiconductor device of claim 18, wherein:
an upper surface of the first clip leg and the upper surface of the first component-attached region are coplanar so that the top side of the first clip exposed from the top side of the encapsulant comprises the upper surface of the first component-attached region; and
an upper surface of the second clip leg and the upper surface of the second component-attached region are coplanar so that the top side second of the second clip exposed from the top side of the encapsulant comprises the upper surface of the second component-attached region.

* * * * *